(12) United States Patent
Cook

(10) Patent No.: US 12,355,470 B2
(45) Date of Patent: Jul. 8, 2025

(54) GENERALIZED NEAR OPTIMAL PACKET ENCODING

(71) Applicant: Samsung Display Co., Ltd., Yongin-si (KR)

(72) Inventor: Gregory William Cook, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 733 days.

(21) Appl. No.: 17/713,050

(22) Filed: Apr. 4, 2022

(65) Prior Publication Data

US 2023/0236796 A1 Jul. 27, 2023

Related U.S. Application Data

(60) Provisional application No. 63/302,103, filed on Jan. 23, 2022.

(51) Int. Cl.
*H03M 7/40* (2006.01)
*H03M 5/14* (2006.01)
*G06F 7/58* (2006.01)

(52) U.S. Cl.
CPC .............. *H03M 5/145* (2013.01); *H03M 7/40* (2013.01); *G06F 7/582* (2013.01)

(58) Field of Classification Search
CPC .......... H03M 5/145; H03M 7/40; G06F 7/582
USPC .................... 341/50, 59, 58, 51, 61
See application file for complete search history.

(56) References Cited

U.S. PATENT DOCUMENTS

| | | | |
|---|---|---|---|
| 5,592,163 A | 1/1997 | Kimura et al. | |
| 10,897,270 B2 | 1/2021 | Wu | |
| 2005/0174262 A1 | 8/2005 | Lee et al. | |
| 2006/0203367 A1 | 9/2006 | McAuliffe et al. | |
| 2016/0248440 A1 | 8/2016 | Greenfield et al. | |
| 2017/0164007 A1 | 6/2017 | Converse | |

(Continued)

OTHER PUBLICATIONS

Duda, Jarek. "Asymmetric numeral systems: entropy coding combining speed of Huffman coding with compression rate of arithmetic coding." *arXiv preprint arXiv:1311.2540* (2014), pp. 1-24.

(Continued)

*Primary Examiner* — Peguy Jean Pierre
(74) *Attorney, Agent, or Firm* — Lewis Roca Rothgerber Christie LLP

(57) ABSTRACT

A communication system includes: a transmitter including: an arithmetic decoder configured to generate an output symbol based on input bits and a symbol frequency table that sets frequencies of excluded symbols to 0 and frequencies of allowed symbols to non-zero values, the transmitter being configured to iteratively generate a sequence of restricted packets and an ending state, the sequence of restricted packets excluding instances of the one or more excluded symbols and to transmit the sequence of restricted packets and the ending state on a channel; and a receiver including: an arithmetic encoder configured to compute an output state based on an input state, an input symbol, and the symbol frequency table, the receiver being configured to: supply an ending state received from the channel and the restricted packets to the arithmetic encoder to iteratively generate a final state, and recover a bit sequence from the final state.

22 Claims, 14 Drawing Sheets

(56) References Cited

U.S. PATENT DOCUMENTS

| | | |
|---|---|---|
| 2019/0268017 A1 | 8/2019 | Gopal |
| 2020/0252656 A1 | 8/2020 | Xu et al. |
| 2020/0326910 A1 | 10/2020 | Parikh et al. |
| 2020/0413106 A1 | 12/2020 | Gladding et al. |
| 2023/0041347 A1* | 2/2023 | Abbasfar ................ H03M 7/46 |

OTHER PUBLICATIONS

Duda, Jarek, et al. "The use of asymmetric numeral systems as an accurate replacement for Huffman coding." *2015 Picture Coding Symposium (PCS)*. IEEE, 2015, pp. 65-69.

European Search Report for EP Application 23152407.5 dated Jun. 16, 2023, 8 pages.

Petrovic, D. et al. "List Viterbi Decoding with Continuous Error Detection for Magnetic Recording," IEEE, 2001, pp. 3007-3011.

* cited by examiner

GENERALIZED NEAR OPTIMAL PACKET ENCODING

CROSS-REFERENCE TO RELATED APPLICATION(S)

This application claims priority to and the benefit of U.S. Provisional Patent Application No. 63/302,103, filed in the United States Patent and Trademark Office on Jan. 23, 2022, the entire disclosure of which is incorporated by reference herein.

FIELD

Aspects of embodiments of the present disclosure relate to systems and methods for implementing low-overhead transition encoding in communication links.

BACKGROUND

In in electronic data communications such as in a serial data link, communications between a sender and a receiver may be synchronized using a clock recovery or clock-data recovery (CDR) process. For example, a receiver may generate a clock from an approximate frequency reference using a phase-locked loop (PLL) and then phase-align the generated signal to the transitions (between high signal levels and low signal levels) in the data stream using CDR. However, recovery of the clock signal can fail if the data run length (e.g., sequence of consecutive 1s or 0s) exceeds a particular length due to there being an insufficient number of transitions for the receiver to detect.

SUMMARY

Aspects of embodiments of the present disclosure relate to the use of arithmetic coding, such as Asymmetric Numeral Systems, for performing packet encoding and decoding to control the codewords that appear on a data link. This control or constraint placed on the codewords that appear on the data link can be used to, for example, limit the run length and/or control the balance of signals high signal levels and low signal levels on the data link.

According to one embodiment of the present disclosure, a transmitter includes: a memory configured to store an initial state computed from a bit sequence of an input data packet; and an arithmetic decoder configured to generate a symbol based on input bits and a symbol frequency table, wherein the symbol frequency table sets frequencies of one or more excluded symbols to 0 and frequencies of one or more allowed symbols to non-zero values, the transmitter being configured to supply the initial state to the arithmetic decoder as the input bits to iteratively generate a sequence of restricted packets and an ending state, the sequence of restricted packets excluding instances of the one or more excluded symbols, and the transmitter being configured to transmit the sequence of restricted packets and the ending state on a channel.

The transmitter may further include: a packet buffer configured to store the input data packet in reversed sequence.

The transmitter may further include: a pseudorandom number generator configured to generate a pseudorandom sequence, wherein the initial state may be computed based on a pseudorandomized data packet computed from the bit sequence of the input data packet and the pseudorandom sequence.

The transmitter may further include an exclusive-or circuit configured to generate the pseudorandomized data packet by computing an exclusive-or of the pseudorandom sequence and the bit sequence of the input data packet.

The transmitter may be further configured to update the symbol frequency table to set a frequency of an additional symbol to 0.

The transmitter may be further configured to update the symbol frequency table to set a frequency of one the one or more excluded symbols to a non-zero value.

The arithmetic decoder may be an asymmetric numeral systems (ANS) decoder.

The ANS decoder may be a table ANS decoder.

According to one embodiment of the present disclosure, a receiver includes: an arithmetic encoder configured to compute a state based on an input state, a symbol, and a symbol frequency table, wherein the symbol frequency table sets frequencies of one or more excluded symbols to 0 and frequencies of one or more allowed symbols to non-zero values, the receiver being configured to: supply an ending state received from a channel and the restricted packets received from the channel to the arithmetic encoder to iteratively generate a final state, the restricted packets excluding instances of the one or more excluded symbols, and recover a bit sequence from the final state; and a memory configured to store a recovered data packet computed based on the bit sequence.

The receiver may further include: a symbol buffer configured to store the restricted packets in reversed sequence.

The receiver may further include: a pseudorandom number generator configured to generate a pseudorandom sequence, wherein the receiver may be configured to compute the recovered data packet based on the pseudorandom sequence and the bit sequence.

The receiver may further include an exclusive-or circuit configured to generate the recovered data packet by computing an exclusive-or of the pseudorandom sequence and the bit sequence.

The receiver may be further configured to update the symbol frequency table to set a frequency of an additional symbol to 0.

The receiver may be further configured to update the symbol frequency table to set a frequency of one the one or more excluded symbols to a non-zero value.

The arithmetic encoder may be an asymmetric numeral systems (ANS) encoder.

The ANS encoder may be a table ANS encoder.

According to one embodiment of the present disclosure, a communication system includes: a transmitter including: a memory configured to store an initial state computed based on a bit sequence of an input data packet; and an arithmetic decoder configured to generate an output symbol based on input bits and a symbol frequency table, wherein the symbol frequency table sets frequencies of one or more excluded symbols to 0 and frequencies of one or more allowed symbols to non-zero values, the transmitter being configured to supply the initial state to the arithmetic decoder as the input bits to iteratively generate a sequence of restricted packets and an ending state, the sequence of restricted packets excluding instances of the one or more excluded symbols, and the transmitter being configured to transmit the sequence of restricted packets and the ending state on a channel; a symbol buffer configured to store the restricted packets; and a receiver including: an arithmetic encoder configured to compute an output state based on an input state, an input symbol, and the symbol frequency table, the receiver being configured to: supply an ending state received from the channel and the restricted packets to the arithmetic encoder to iteratively generate a final state, the sequence of restricted packets excluding instances of the one or more excluded symbols, and recover a bit sequence from the ending state; and a memory configured to store a recovered data packet computed based on the bit sequence.

The transmitter may further include: a transmitter pseudorandom number generator configured based on a seed value to generate a pseudorandom sequence; and a transmitter exclusive-or circuit configured to compute an exclusive-or of the pseudorandom sequence and the bit sequence of the input data packet to compute a pseudorandomized data packet, wherein the initial state is computed based on the pseudorandomized data packet and the receiver may further include: a receiver pseudorandom number generator configured based on the seed value to generate the pseudorandom sequence; and a receiver exclusive-or circuit configured to compute an exclusive-or of the pseudorandom sequence and the bit sequence to compute the recovered data packet.

The transmitter may further include: a packet buffer configured to store a bit sequence; and the symbol buffer, and the receiver may be free of buffers.

The receiver may further include: a packet buffer configured to store a bit sequence; and the symbol buffer, and the transmitter may be free of buffers.

The arithmetic decoder may be an asymmetric numeral systems (ANS) decoder, and the arithmetic encoder may be an asymmetric numeral systems (ANS) encoder.

The communications system may be further configured to update the symbol frequency table at the arithmetic decoder and the arithmetic encoder to set a frequency of an additional symbol to 0.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
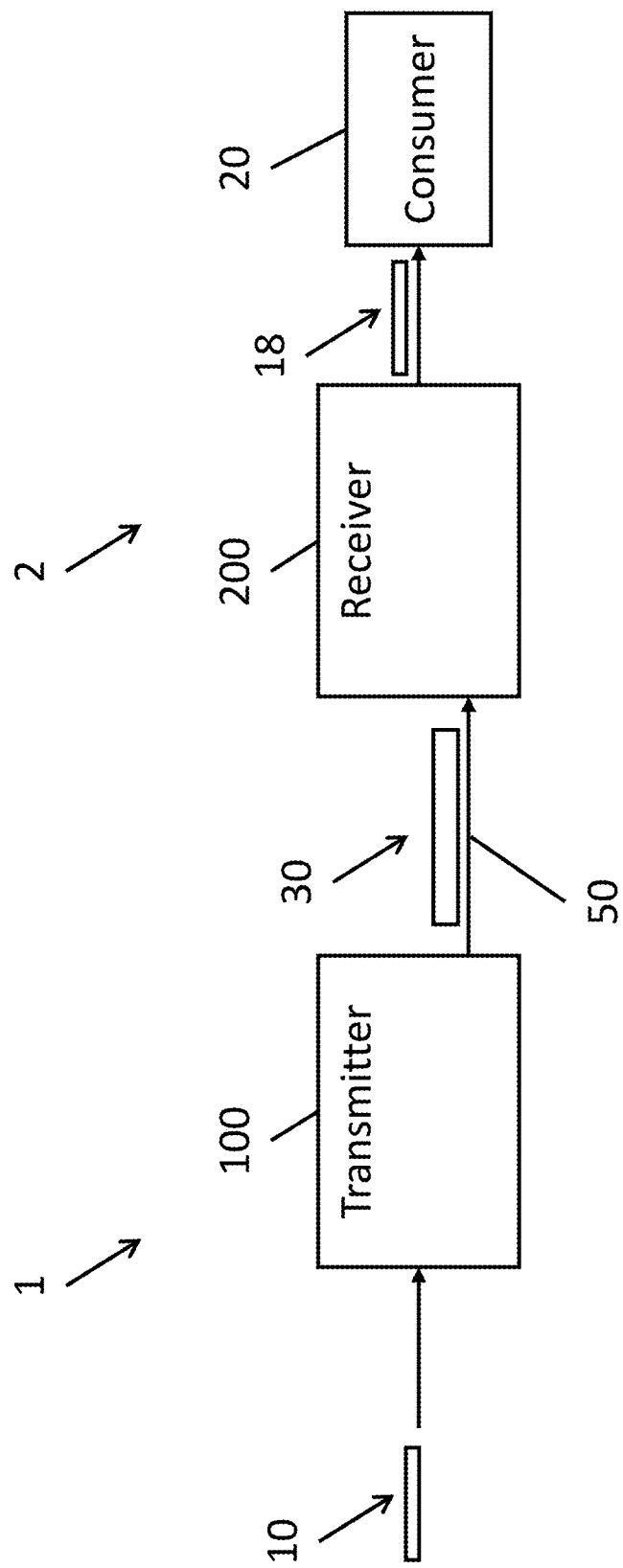
FIG. 1 is a schematic block diagram of a serial link between a transmitter and a receiver, the transmitter including an encoder in accordance with embodiments of the present disclosure and the receiver including a decoder in accordance with embodiments of the present disclosure.

In the following detailed description, only certain example embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to systems and methods for reducing or minimizing the run length of digital data in a communications system. In more detail, some aspects of embodiments of the present disclosure relate to systems and methods for encoding digital data to guarantee a limited run length or to guarantee that the run length of a packet of digital data is less than or equal to a particular limit in the form of run-length limited codes.

FIG. 1 is a schematic block diagram of a serial link between a data source 1 and a data sink 2, the sender 1 including a transmitter 100 in accordance with embodiments of the present disclosure and the data sink 2 including a receiver 200 in accordance with embodiments of the present disclosure. In the arrangement shown in FIG. 1, original data 10 is to be transmitted from the data source 1 to the data sink 2, where the original data 10 reconstructed by the receiver 200 as decoded data 18. The decoded data 18 may then be consumed by a data consumer 20 at the data sink 2. In more detail, the transmitter 100 encodes the original data 10 into encoded data 30, and the encoded data 30 is transmitted over a data link 50 to the receiver 200. The receiver 200 then decodes the encoded data 30 to reconstruct the original data 18.

According to various embodiments of the present disclosure, the transmitter 100 and the receiver 200 may, respectively, be referred to as a transmitter circuit and a receiver circuit and may be implemented using various processing circuits such as a central processing unit (CPU), an application processor (AP) or application processing unit (APU), a field programmable gate array (FPGA), an application specific integrated circuit (ASIC), a digital signal processor (DSP), a display driver integrated circuit (DDIC), and/or a graphics processing unit (GPU) of one or more computing systems, or combinations thereof. For example, the transmitter 100 and the receiver 200 may be components of the same computer system (e.g., integrated within a single enclosure, such as in the case of a smartphone, tablet computer, or laptop computer), may be separate components of a computer system (e.g., a desktop computer in communication with an external monitor), or may be separate computer systems (e.g., two independent computer systems communicating over the data link 50), or variations thereof (e.g., implemented within special purpose processing circuits such as microcontrollers configured to communicate over the data link 50, where the microcontrollers are peripherals within a computer system). As would be understood by one of skill in the art, the transmitter circuit may be implemented using a different type of processing circuit than the receiver circuit. In addition, as would be understood to one of skill in the art, the various processing circuits may be components of a same integrated circuit (e.g., as being components of a same system on a chip or SoC) or may be components of different integrated circuits that may be connected through pins and lines on a printed circuit board. For the sake of conciseness, the transmitter 100 and the receiver 200 will each be described herein as including a processor and memory storing instructions that configure the processor to perform various operations, where the processor and memory will be interpreted herein to refer to the processing circuit in its various forms, whether the particular operations are performed in software (e.g., by a CPU or AP executing instructions), in hardware (e.g., in special purpose digital logic of a configured ASIC, an FPGA, a GPU, a DDIC, or the like), or combinations thereof (e.g., with some operations performed in software and other operations performed in hardware).

As a concrete example, in the case of a data link 50 for controlling a display device, the sender 1 may include a graphics controller such as a graphics processing unit (GPU) or an application processing unit (APU) of a computer system (e.g., a laptop computer, a smartphone, a tablet computer, or the like) that generates image data as original data. This image data or original data 10 is then transmitted over a data link 50 to a display panel (e.g., a liquid crystal display panel or an organic light emitting diode display panel), which includes a receiver 200 for receiving and decoding the encoded data 30 into the decoded image data 18. The decoded image data 18 may then be supplied to a data consumer 20 such as processing circuits configured to convert the received decoded image data 18 into signals that control the display panel to display images (e.g., graphical user interfaces, video, and other display elements) as represented in the decoded image data 18.

In digital communications, a transmitter 100 and a receiver 200 can be synchronized using a clock recovery or clock-data recovery (CDR) process. A receiver using a CDR process typically operates by detecting the time of transitions between symbols on the physical layer of the data link (e.g., voltage levels of a signal on the link) and phase-aligning the clock of the receiver based on the detected transitions.

Figure 2:
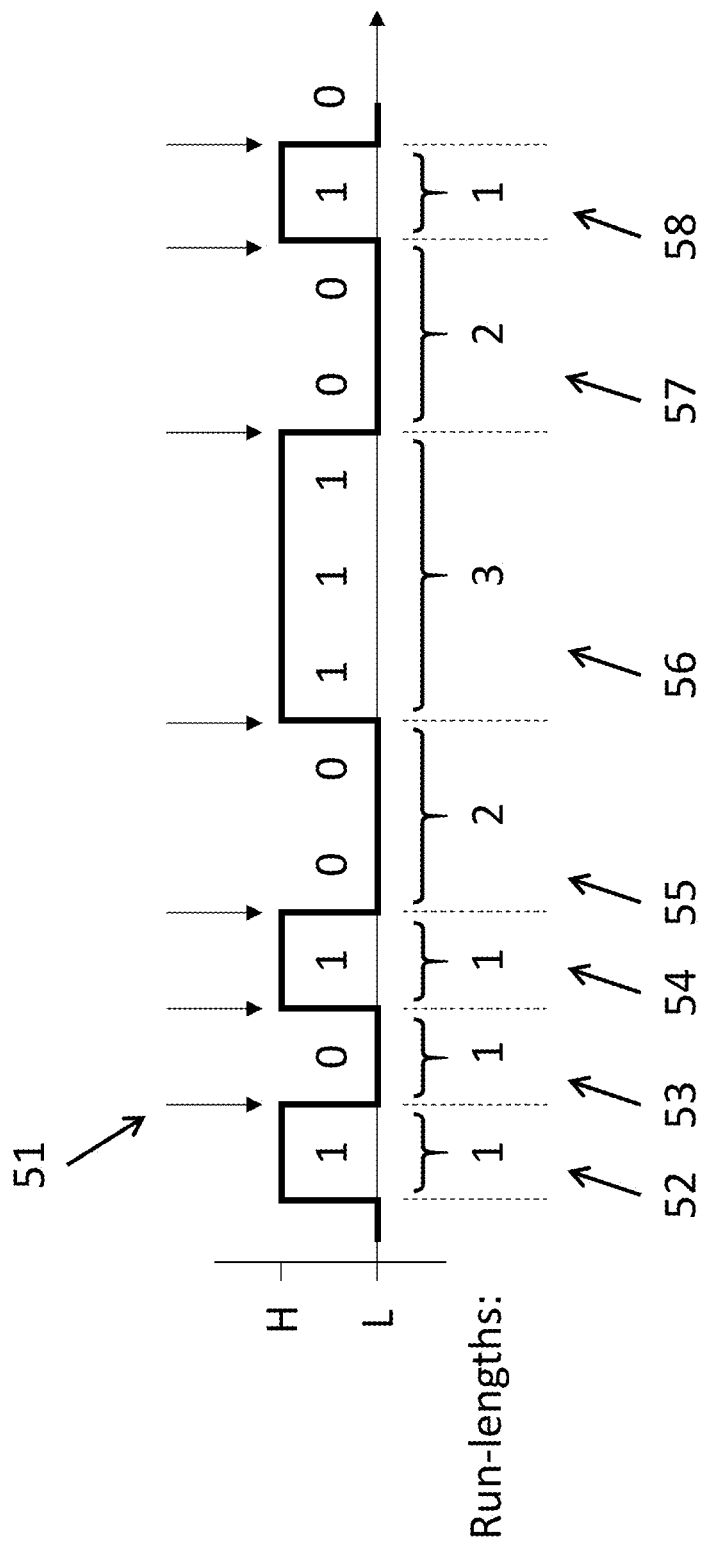
FIG. 2 is a depiction of binary data transmitted on a data link using a unipolar line code, where logical 1 values are encoded as logic-level high (H) signals and logical 0 values are encoded as logic-level low signals (L).

FIG. 2 is a depiction of binary data transmitted on a data link 50 using a unipolar line code, where logical 1 values are encoded as logic-level high (H) signals and logical 0 values are encoded as logic-level low signals (L). (Embodiments of the present disclosure are not limited to use with unipolar line codes and also applicable to data links using, for example, bipolar line codes.) The logic-level high and logic-level low signals may be physically encoded on the data link as a high voltage (e.g., 5 volts or 3.3 volts) and a low voltage (e.g., 0 volts), respectively. In the example shown in FIG. 2, the data bit sequence 101001110010 is being transmitted over the data link 50. Transitions between logic-level low (L) and logic level high (H) voltages are shown by arrows 51. Stretches of repeated bits during which the signal does not change are referred to as runs. FIG. 2 specifically highlights seven different runs labeled 52, 53, 54, 55, 56, 57, and 58 along with their corresponding run-lengths. Based on the data bit sequence 101001110010, runs 52, 53, 54, 55, 56, 57, and 58 have corresponding run-lengths of 1, 1, 1, 2, 3, 2, and 1.

If the received signal contains an excessively long run length (e.g., a long sequence of data symbols having the same voltage level), the CDR process can fail due to there being an insufficient number of transitions in the received signal, which can cause problems in the recovery of the clock. For example, in a unipolar non-return-to-zero (NRZ) encoding, a logic-level high value (e.g., high voltage) may be used to encode a 1 and a logic-level low value (e.g., a low voltage) may be used to encode a 0. Directly encoding the values of any particular input data can result in arbitrarily long run lengths. For example, a long sequence of words that are all zeroes (0s) or a long sequence of words that are all ones (1s) would result in a signal being continuously at a logic-level low value or a logic-level high value, respectively, with no transitions between bits to use for CDR. While some problems arising from long run lengths are described above in the context of unipolar NRZ encoding, similar problems may occur in other types of modulation that may have more than two signal amplitude levels (e.g., pulse amplitude modulation or PAM, with more than two levels, such as PAM4 which uses four amplitude levels).

As such, aspects of embodiments of the present disclosure relate to systems and methods for encoding input data to generate encoded data bits, where the encoded data bits are guaranteed to have a limited run-length (e.g., a run length that is no longer than a particular limited number of bits). Limiting the run length of the data encoded in this way improves the ability of a decoder to perform CDR, thereby improving the quality of the communication link between the sender and the receiver.

Figure 3:
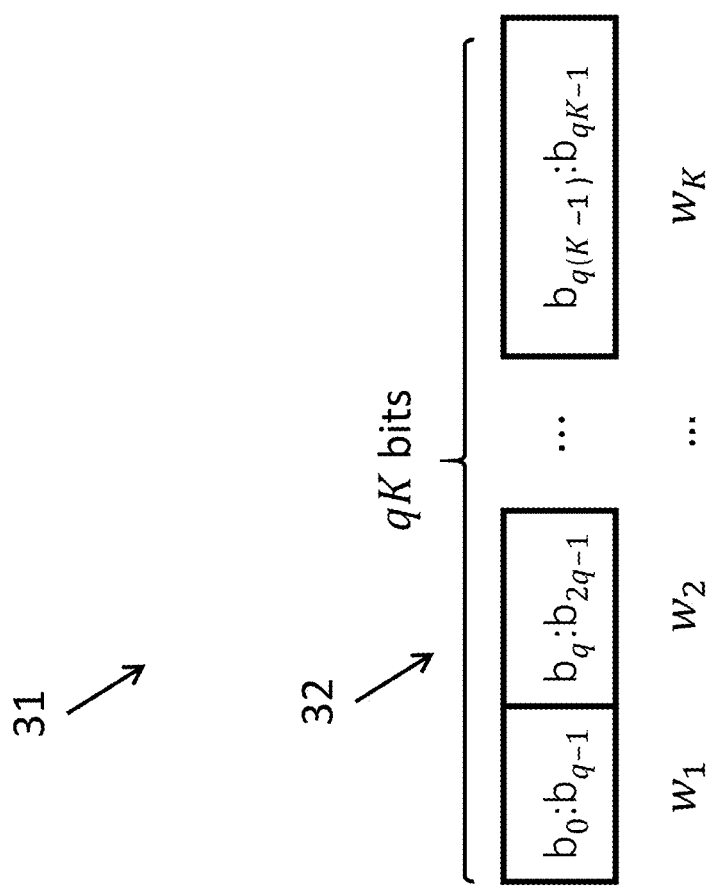
FIG. 3 is a schematic depiction of a data packet according to one embodiment of the present disclosure.

Some aspects of embodiments of the present disclosure relate to run-length limited codes where input data is encoded into one or more data packets, each data packet including a plurality of words. In the following description, each data packet includes K words (or up to K words), and where each word has q bits (in other words, each data packet may include up to K q-bit words). Because each word has q bits, each word can take on $Q=2^q$ possible values (e.g., when q=6, then $Q=2^q=64$, with integer values in the range of 0 to 63). FIG. 3 is a schematic depiction of a data packet. Each data packet 31 may therefore be viewed as including a payload 32 of qK bits which may be numbered or indexed from 0 to qK−1, as in: b[0:qK−1]. Each q-bit codeword w may take on any value from 0 to $2^q-1$, and may also be represented as an array of q bits, e.g., b[0:q−1]. The payload 32 can therefore be viewed as K words that are concatenated together into an array of qK bits:

$w_1, w_2, \ldots, w_K$ $w_1(b[0:q-1]), w_2(b[q:2q-1]), \ldots, w_K(b[q(K-1):qK-1])$ For the sake of illustration, in the following examples, q is set to 6, such that each word is 6-bits long, with possible values in the range of 0 to 63 (6'b000000 to 6'b111111). However, embodiments of the present disclosure are not limited thereto, and q may be set to other values such as 8, 10, 16, or the like, in accordance with design parameters and requirements of the encoding and decoding system and based on the application.

Some aspects of embodiments of the present disclosure relate to ensuring that there is at least one transition in every word of the encoded data by ensuring that none of the words in the encoded data 30 are all-zeroes (e.g., q consecutive 0s) or all-ones (e.g., q consecutive 1s), such as 6'b000000 and 6'b111111 in the case where q=6. In other words, some aspects of embodiments of the present disclosure relate to eliminating all-zero and all-one words from the encoded data 30 or ensuring that the encoded data 30 does not include (e.g., is free of) words that are all-zeroes and does not include any words that are all-ones. By eliminating all-zero words and all-one codewords from the encoded data, the run length is limited to a worst case of 2(q−1) bits.

Figure 4:
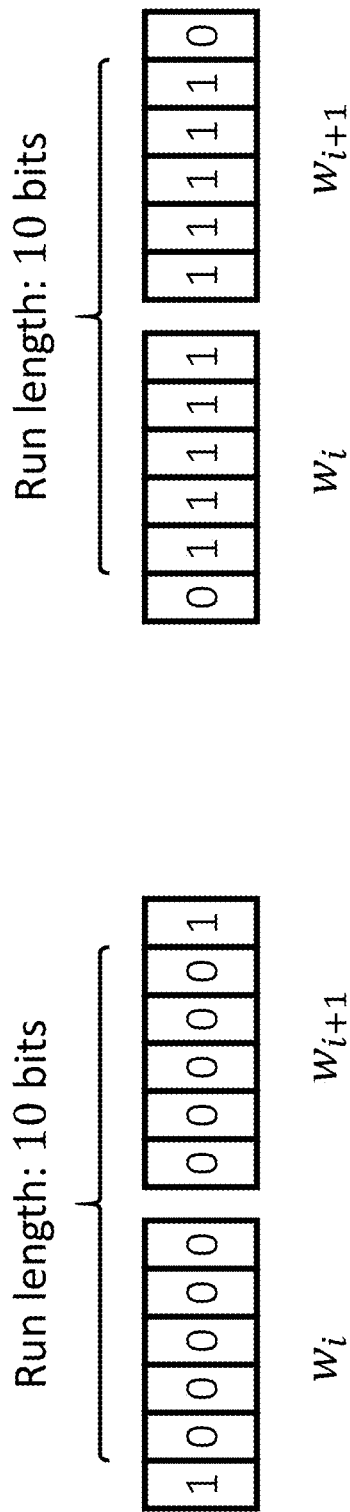
FIG. 4 is a schematic depiction of a maximum run length in an example scenario of a six-bit word (q=6) when data is encoded in a data packet in accordance with embodiments of the present disclosure.

FIG. 4 is a schematic depiction of a maximum run length in an example scenario of a six-bit word (q=6) when data is encoded in a data packet in accordance with embodiments of the present disclosure. As shown in FIG. 4, when the 6-bit word 6'b100000 (identified as word $w_i$) is followed by the 6-bit word 6'b000001 (identified as word $w_{i+1}$, then there is a run of ten 0s (2×(6−1)). Likewise, when the 6-bit word 6'b011111 is followed by the 6-bit word 6'b111110, then there is a run of ten 1s. Because the all-zero and all-one words have been eliminated, any other pairs of consecutive words will result in shorter run lengths than the limited maximum run length of 2(q−1) bits.

In addition, some CDR systems may have difficulties or lower reliability in recovering clocks when presented with particular words. For example, the Mueller-Muller CDR system may have problems with codewords of alternating patterns of 0s and 1s (e.g., in the case of 6-bit codewords, the codewords 6'b010101 and 6'b101010) and tends to fail to recover the clock when presented with such codewords. Furthermore, some codewords may be reserved for use as commands transmitted between the transmitter 100 and the receiver 200 as a form of in-band signaling, such as for a reserved stop symbol.

Accordingly, aspects of embodiments of the present disclosure relate to a generalized technique for excluding particular, specified codewords from an encoded message. Examples of such excluded codewords include, but are not limited to, the all zeroes (0s) codeword (such as the 6-bit 6'b000000), the all ones (1s) codeword (such as the 6-bit 6'b111111), alternating value codewords (e.g., the 6-bit codewords 6'b010101 and 6'b101010).

As such, aspects of embodiments of the present disclosure will be described in more detail below with respect to systems and methods for encoding original data 10 to generate encoded data 30 where the encoded data 30 is free of words that are all-ones or all-zeroes (e.g., none of the words has q 0s and none of the words has q 1s). In addition, aspects of embodiments of the present disclosure relate to systems and methods for decoding encoded data 30 to generate decoded data 18 matching the original data 10, which may include words that are all-ones and/or words that are all-zeroes. Excluding particular codewords from a coding can be thought of as a change of base or radix. For example, a 6-bit codeword can represent a value in base 64 because it can take on any of 64 different possible values (in a similar manner, a 4-bit codeword can represent a hexadecimal value, which is one of 16 different possible values). Excluding the all zeroes value 6'b000000 and the all ones value 6'b111111 reduces the codeword to a base 62 value. Additional codewords may also be excluded from the coding, such as codewords to be reserved for use as in-band commands or based on characteristics of the system (e.g., for better CDR performance or improving direct current DC balance).

The number of excluded codewords may be denoted as E. As noted above, for a q-bit codeword, there are $Q=2^q$ possible codewords, so the base N of the encoded data is:

$$N = Q - E \quad (1)$$

and, therefore, the theoretical optimum efficiency of such a coding system that performs a chance of base (or change of radix) is:

$$\text{Efficiency} \approx \log N / \log Q \quad (2)$$

Encoding the same data in a smaller base generally results in additional overhead bits, which determines the actual efficiency of the coding.

Accordingly, some aspects of embodiments of the present disclosure relate to a configurable encoder that encodes input words into codewords, where the encoder is re-configurable to output only codewords within a particular subset of all possible codewords (e.g., where the line encoder is configured such that it does not output particular codewords or where particular codewords are excluded from the output). In some embodiments, these codeword exclusions are selected to control (limit) the run length of the encoded data that appears on the transmission line or data link 50. In some embodiments, codewords are excluded to reserve codewords for commands (e.g. in-band signaling), to omit codewords to improve CDR performance, and to omit codewords to result in DC-balanced packets (e.g., equal numbers of 0s and 1s). However, embodiments of the present disclosure are not limited thereto, and encoders according to various embodiments may be configured to exclude codewords from the encoded message for other purposes.

Some aspects of embodiments of the present disclosure further relate to systems and methods for decoding the encoded data bits to recover the original input data.

Some embodiments of the present disclosure are also simple to implement, whether in software (e.g., running on a processor such as a microcontroller), implemented in hardware (e.g., digital logic), a field programmable gate array (FPGA), or the like. For example, in some embodiments the core encoding and decoding processes perform only shifts, addition (and/or subtraction), and bitwise exclusive-or (XOR) operations, without multiplication or division, and can be implemented in a data path with a small, fixed bitwidth. Some aspects of embodiments also relate to implementations in which the encoder and the decoder can be reconfigured to exclude different codewords while using the same hardware, thereby allowing the coding to be switched at packet boundaries (e.g., the encoder and decoder can apply different coding systems having different excluded codewords to different packets, while using the same hardware implementation). Some aspects of embodiments relate to a transmitter-receiver pair in which a packet buffer is used in only a single location—e.g., only a packet buffer at the transmitter on only a packet buffer at the receiver, without requiring packet buffers at both the transmitter and the receiver. For example, in some embodiments no packet buffer is required at the transmitter.

In more detail, some aspects of embodiments of the present disclosure relate to use of an arithmetic codec, such as Asymmetrical Numeral Systems (ANS). In more detail, in some embodiments, an ANS decoder is used to generate transmission packets of encoded data and an ANS encoder is used to recreate or recover the original packets from the encoded data.

Generally, arithmetic coding is a form of entropy encoding in which more frequently occurring input symbols are represented (or encoded) using fewer bits and less-frequently occurring input symbols are represented using more bits, resulting in fewer bits used total. Other forms of entropy coding, such as Huffman coding, separate the input into component symbols (e.g., different Unicode characters in the case of Unicode text) and replace each symbol with a code. In contrast, arithmetic encoding encodes the entire message into a single number. This has the effect of allowing partial bits per symbol, which can more closely match the entropy of the symbol.

Generally, given a sequence of symbols (s) drawn from a collection of possible symbols (e.g., enumerated from 0 to N−1), an arithmetic encoder produces a sequence of bits (or bytes). Given a bit (or byte) sequence, an arithmetic decoder produces a sequence of symbols (s) where the symbols are drawn from the collection of possible symbols (e.g., enumerated from 0 to N−1). If the frequency count of the symbols s is "flat," (e.g., approximately equal) arithmetic coders are equivalent to radix conversion or base conversion. Asymmetric Numeral Systems (ANS) are one type of arithmetic coder which requires only one value (state), and which operate on a first-in/last-out basis.

Accordingly, aspects of embodiments of the present disclosure relate to using an arithmetic decoder, such as an ANS decoder, at a transmitter to map a bit sequence (the original data) into a sequence of symbols drawn from a constrained set of symbols (e.g., excluding the all zeroes and all ones symbols, and any other excluded codewords) to generate encoded data. Similarly, some aspects of the present disclosure relate to using an arithmetic encoder, such as an ANS encoder, at a receiver to map a received encoded message of symbols to the bit sequence of the original data. The arithmetic decoder used at the transmitter and the arithmetic encoder used at the receiver are configured using symbol frequency tables, specifying the frequency with which various symbols appear in the sequence of symbols transmitted on a channel (e.g., a communications link or data link) between the transmitter and the receiver. The arithmetic decoder and the arithmetic encoder are configured to exclude particular codewords or symbols by setting the symbol frequency of those excluded codewords or excluded symbols to zero in the symbol frequency tables.

In addition, if the distribution of original symbols is approximately flat, then there is no need to transmit symbol frequency tables from the transmitter to the receiver, thereby reducing the overhead.

Asymmetric Numeral Systems (ANS) are described in detail, for example, in Duda, Jarek. "Asymmetric numeral systems: entropy coding combining speed of Huffman coding with compression rate of arithmetic coding." *arXiv preprint arXiv:*1311.2540 (2013). and Duda, Jarek, et al. "The use of asymmetric numeral systems as an accurate replacement for Huffman coding." 2015 *Picture Coding Symposium* (*PCS*). IEEE, 2015. the entire disclosures of which are incorporated by reference herein. For the sake of completeness, a basic introduction to ANS is presented below.

As used herein in reference to ANS, the variable s is used to indicate a symbol from a collection of N symbols, which may be enumerated or ordered from 0 to N−1. $F_s$ denotes the frequency or count of a corresponding symbol s. $B_s$ denotes a cumulative frequency of symbols, where:

$$B_s = B_{s-1} + F_{s-1}$$

$$B_A = 0$$

$$M = B_N$$

where M represents a total count of all of the symbols. Given the above, the range from 0 to M may be thought of as divided into N different regions or slots, with one slot for each different symbol s. Each "slot" has a size of $F_s$, that is, a size based on the frequency or count of the corresponding symbol s, where higher frequency symbols have larger slots within the range of 0 to M and lower frequency symbols have smaller slots. A valid symbol s must have a frequency $F_s$ that is greater than zero (e.g., at least 1) in order to be used by the ANS coding system. When the frequency $F_s$ of a symbol s is 0, then that symbol will not appear in the output of the ANS decoder (and generally cannot be encoded by an ANS encoder). The information regarding the count or frequency $F_s$ of each of the N symbols s may be represented by a symbol frequency table that maps from symbols s to their corresponding frequencies $F_s$.

Figure 5:
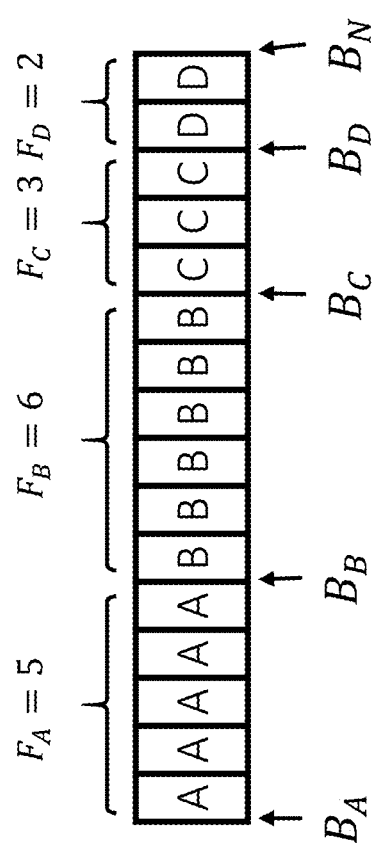
FIG. 5 depicts the division of a range of M into four "slots" or regions corresponding to four different symbols of a code, where the slots have different sizes based on the frequencies or counts of the symbols.

FIG. 5 depicts the division of the range of M into four "slots" or regions corresponding to the four different symbols, where the slots have different sizes based on the frequencies or counts of the symbols. In this example, a code may have four symbols s: 'A,' 'B,' 'C,' and 'D.' These symbols may be mapped to a finite set of non-negative integers (e.g., 0 to N−1) for convenience where, in this example A→0, B→1, C→2, and D→3. The symbol 'A' may have a count $F_A=5$, the symbol 'B' may have a count $F_B=6$, the symbol 'C' may have a count $F_C=3$, and the symbol 'D' may have a count $F_D=2$. Therefore, assuming the order of the symbols is 'A,' 'B,' 'C,' 'D':

$$B_A = 0$$

$$B_B = B_A + F_A = 0 + 5 = 5$$

$$B_C = B_B + F_B = 5 + 6 = 11$$

$$B_D = B_C + F_C = 11 + 3 = 14$$

$$B_N = B_D + F_D = 14 + 2 = 16$$

Therefore, in this example, $M = B_N = 16$.

Given a next symbol s in the sequence of symbols to be encoded and the current state x, in some approaches to ANS, an encoder applies an encoding function C(s,x) to compute a next state x' of the encoder in accordance with:

$$C(s,x) = x' = M\lfloor x/F_s \rfloor + (x \bmod F_s) + B_s \qquad (3)$$

where the encoder is configured with a symbol frequency table and the encoder looks up the value of $F_s$ corresponding to the given symbol s by identifying the corresponding entry in the symbol frequency table (the cumulative frequency $B_s$ can also be computed from the symbol frequency table and/or pre-computed and stored as part of the symbol frequency table).

In other words, the next state x' encodes both the given state x and the next symbols based on the symbol frequency $F_s$ of the symbol s, as specified in the symbol frequency table. Therefore, a sequence of symbols can be encoded by starting with an initial state and iteratively combining the current state with the next symbol in the sequence to generate an ending state that represents all of the encoded symbols. The bit representation of the ending state x corresponds to the production of a sequence of bits that encodes the sequence of symbols. As seen in Equation (3), above, as each additional symbol s is encoded, the next state x' is a larger value than the input state x, at least because the input state x is divided by $F_s$ (rounded down) and multiplied by M and because M>$F_s$. Therefore, the number of bits necessary to represent the state grows as more symbols s are encoded.

A decoder reverses the operations performed by the encoder to recover the symbols of the sequence. To compute a next symbol s of the sequence from the current state x', the decoder finds a symbol s that satisfies the relationship:

$$B_s \leq x' \bmod M < B_{s+1} \quad (4)$$

As before, the cumulative frequency values such as $B_s$ and $B_{s+1}$ may be pre-computed and stored as part of the symbol frequency table that configures the decoder or may be computed from the symbol frequencies $F_s$. The decoding function D(x') computes the next decoder state x based on the identified symbol s in accordance with:

$$D(x') = x = F_s \lfloor x'/M \rfloor + (x' \bmod M) - B_s \quad (5)$$

In other words, the symbols are extracted from the received bit representation of the ending state in a first-in/last-out manner by extracting the next symbol s from the current state x' and computing the next state x from the current state x' and proceeding iteratively until all of the symbols have been extracted. As seen in Equation (5), above, as each additional symbol s is decoded from the input state x', the next decoder state x is a smaller value than the input state x', at least because the input state x' is divided by M (rounded down) and multiplied by $F_s$ and because M>F. Therefore, the number of bits necessary to represent the current state shrinks as more symbols s are decoded from the state.

In addition to the above descriptions and equations which describe how the state x evolves, there is an additional observation which allows one to convert the state x to a stream by a technique called renormalization. For example, for the case of table ANS it can be shown that as long as the state x is between M and 2M−1, that an encoding and decoding will be unique. One example method to stream bits is to create a container which holds the state. As the value of the state x grows, in some embodiments, the encoder takes the least significant bits in sets of blocks and transfers these LSBs to the output stream as those are known to be fixed. Then the state x is renormalized between M and 2M−1. Since the maximum number of bits per symbol is always known in ANS via the frequency table, block transfer may be deferred until the container is almost full since the container size is fixed and known. Typical sizes of containers in some embodiments are 32 or 64 bits with block size of 8 bits, but embodiments of the present disclosure are not limited thereto and these values can differ based on the implementation. Bit order is maintained within the blocks so that the encoder and decoder can write and read the same values for a given number of bits. Since the block size is fixed, the streaming block order may be reversed either by the encoder or the decoder. For efficient streaming, the very first symbol or collection of bits is used to set the starting state since a symbol can always be converted to a state via the encoding equations, and the starting state is always arbitrary. Conversely, the decoder reads the first log$_2$(M) bits first to determine the starting state for the decoder (which is the ending state of the encoder). Then decoding proceeds as described herein. When the second-to-last symbol is decoded the remaining state x describes the first symbol encoded.

As noted above, the decoder computes symbols s based on finding symbols that satisfy the inequality in Equation (4)—essentially finding which "slot" (e.g., as shown in FIG. 5) satisfies the relationship. Furthermore, as noted above, $B_s = B_{s-1} + F_{s-1}$, and therefore the size of the "slot" is based on the frequency or count of symbol s. As such, when performing the encoding, fewer bits are needed to encode a next state x' for symbols associated with large slots (more frequently occurring symbols) than for symbols associated with smaller slots (less frequently occurring symbols) If the frequency or count of the symbol s is set to 0, then the decoder will not output that symbol s (e.g., because the size of the slot will be zero).

Aspects of embodiments of the present disclosure relate to using an ANS decoder or arithmetic decoder that is configured by setting the frequency or count of particular symbols to zero, such that particular symbols (specified sequences of bits) are not output when performing the encoding of a data packet to be transmitted on a communication channel.

Figure 6:
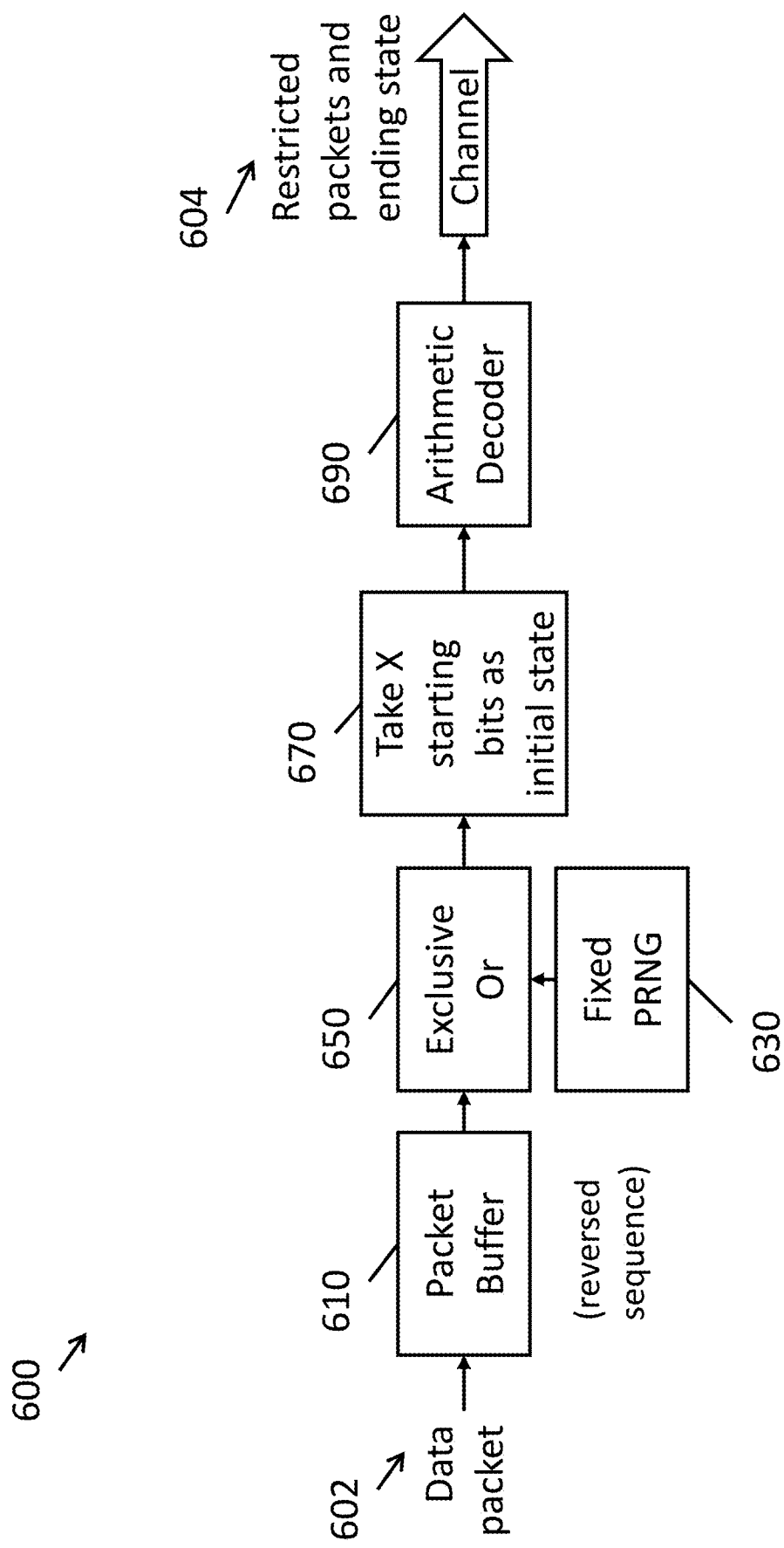
FIG. 6 is a schematic depiction of a transmitter including an arithmetic decoder according to one embodiment of the present disclosure.

FIG. 6 is a schematic depiction of a transmitter 600 including an arithmetic decoder according to one embodiment of the present disclosure. In various embodiments of the present disclosure, the various blocks shown in FIG. 6 perform operations that are implemented in hardware (e.g., digital logic) or in software (e.g., program instructions that, when executed by a processor, cause the processor to perform particular operations). As shown in FIG. 6, a data packet 602 including a sequence of bits (or bit sequence) to be transmitted is supplied as input to the transmitter 600, which generates restricted packets 604 where particular symbols (e.g., the all ones or all zeroes words) are restricted or excluded from the possible outputs. In more detail, in the embodiment shown in FIG. 6, an arithmetic decoder 690 is used to convert input sequences of bits into output symbols, where the possible output symbols are codewords (e.g., q-bit codewords, such as 6-bit words continuing the examples above). In some embodiments of the present disclosure, the arithmetic decoder 690 is implemented in hardware, such as digital logic implemented in an AP, a GPU, a DDIC, a DSP, an FPGA, an ASIC, or the like. In some embodiments of the present disclosure, the arithmetic decoder 690 is implemented in software, such as by executing instructions on a processor including an arithmetic logic unit (ALU), such as a CPU, AP, or GPU.

As noted above, by setting the frequency or count $F_s$ of particular codewords to zero, the arithmetic decoder 690 will not output those particular codewords. As noted above, some examples of codewords that are undesirable for transmission are the all zeros codeword, the all ones codeword, and alternating codewords (e.g., in the case of q=6, then setting the frequency $F_{6'b000000}=0$, $F_{6'b111111}=0$, $F_{6'b101010}=0$, and $F_{6'b010101}=0$), the arithmetic decoder will not output these particular words, thereby ensuring that the run length will not exceed 2(q−1) bits (e.g., 10 bits in the case of q=6) and also improving the recovery of the clock by a Mueller-Muller CDR system.

In order to provide the arithmetic decoder 690 with an appropriate input state x representing the data packet 602 for generating a sequence of symbols s (e.g., each symbol being a q-bit word) to be transmitted as the restricted packets 604, aspects of embodiments of the present disclosure relate to performing preprocessing of the data packet 602.

Figure 7:
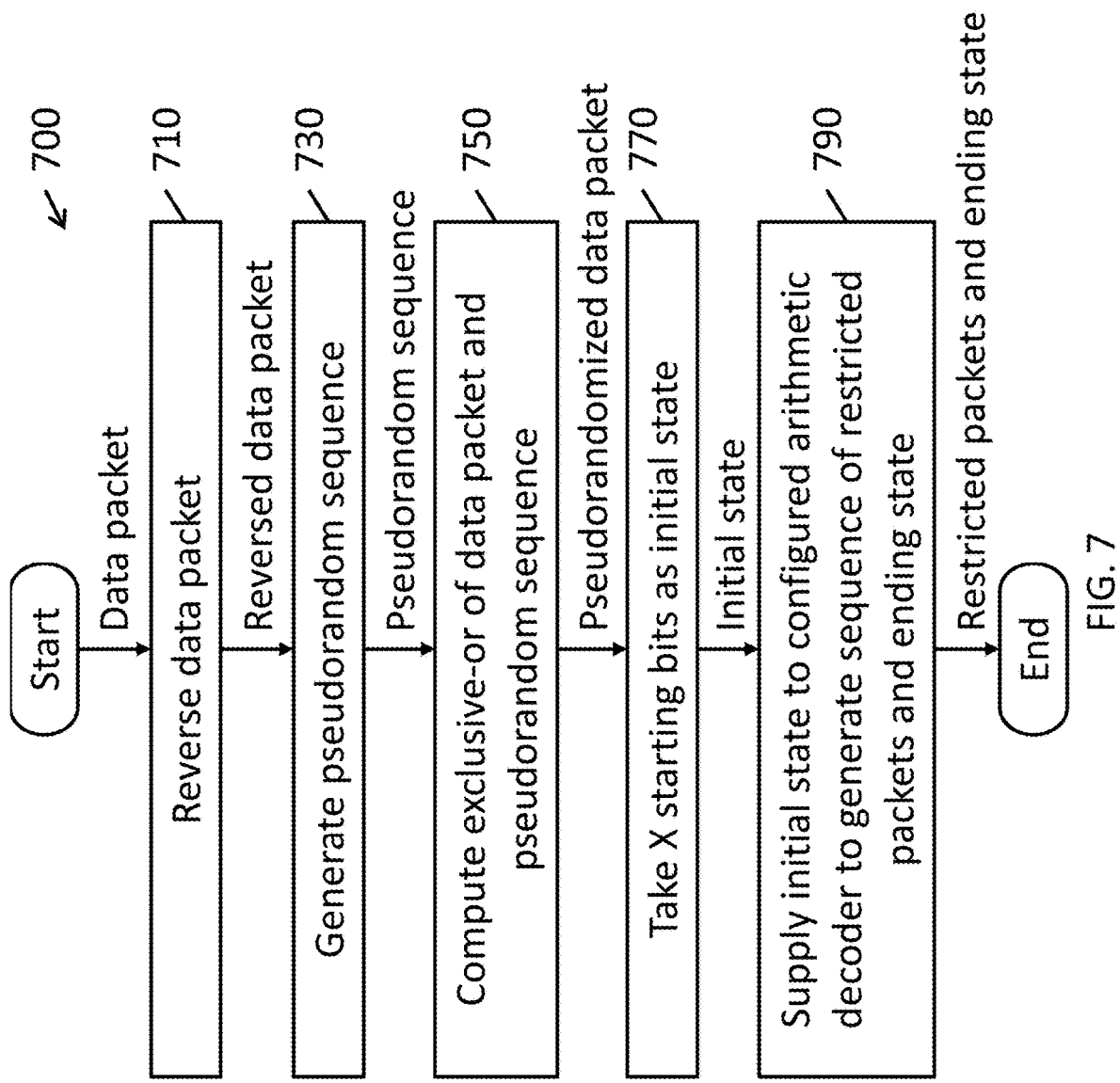
FIG. 7 is a flowchart depicting a method for encoding original data to generate a data packet according to one embodiment of the present disclosure.

FIG. 7 is a flowchart depicting a method 700 for encoding original data to generate a data packet according to one embodiment of the present disclosure.

In some embodiments, the encoder reverses the data packet at operation 710 (e.g., reversing 0x04FA7DEE to 0xEE7DFA04) such that the subsequent reversal of the bytes by the arithmetic decoder 690 causes the data to be transmitted in the correct order in the data channel. (In some alternative embodiments, the packet buffer 610 is omitted from the transmitter 600 and reversal may be performed instead at the receiver, as discussed in more detail below.)

When applying an arithmetic decoder to generate the encoded symbols and an arithmetic encoder to recover the data packet from the encoded symbols, the efficiency of the arithmetic decoder and the arithmetic encoder is most efficient when the distribution of symbols is uniform or as close to uniform as possible (or maximally flat). However, the input data packet 602 may have arbitrary data in which some sequences of bits may appear more commonly than other sequences of bits, and therefore there are no guarantees that the actual distribution or frequency of symbols will be maximally flat. In circumstances where the input sequence is not maximally entropic (e.g., where the distribution is not uniform) a decoder may cause code expansion (the expansion of the input data such that the encoded version is larger than the input data, thereby decreasing the efficiency of the code).

Accordingly, some embodiments of the present disclosure include a fixed pseudorandom number generator (PRNG) 630. The fixed PRNG 630 is used to generate a sequence of pseudorandom bits at operation 730, as controlled by a seed value (e.g., a fixed seed value, where the PRNG generates the same sequence of pseudorandom bits for any given seed value). Examples of pseudorandom generators include, but are not limited to, the Mersenne Twister, xorshift generators, WELL generators, the Yarrow algorithm, stream ciphers, and block ciphers running in output feedback mode. An exclusive-or (XOR) circuit 650 combines, at operation 750, the bits of the data packet with the pseudorandom sequence of bits generated by the fixed PRNG 630, thereby generating a pseudorandomized data packet that is nearly uniform due to the randomization caused by the fixed PRNG 630 (referred to as a pseudorandomized data packet), as discussed in more detail below.

In some embodiments, the fixed PRNG 630 and the exclusive-or (XOR) circuit 650 are omitted (along with omitting corresponding operations 730 and 750 of the method) in circumstances where the input data packet 602 has a sufficiently uniform distribution of data, such as where the input data packet 602 is encrypted data or compressed data, because encrypted or compressed data typically already exhibits the property of uniform distribution.

At operation 770, the transmitter stores, in a memory 670, the X starting bits as the initial state that is provided to the arithmetic decoder 690. The number of starting bits X in various embodiments may be tuned based on the conditions and the requirements associated with the data packet. The efficiency approaches the theoretical maximum as the number of bits X increases. In some embodiments, X is less than the bitwidth of the maximum size of the state. The arithmetic decoder 690 then repeatedly applies a decoder function $D(x')=(x,s)$ to generate a sequence of symbols s as described above, where the arithmetic decoder is configured with a symbol frequency table that has $F_s=0$ for particular excluded or restricted packets or codewords (e.g., as discussed above, the all zeroes codeword, the all ones codeword, codewords with alternating bit values, etc.). The number of generated symbols from the decoder can be estimated from the efficiency of the coding scheme and the number of bits X, which is known a priori by both the encoder and the decoder. In some embodiments, one additional symbol is added to the total predicted number of symbols by the efficiency to account for some imprecision in the prediction. If the actual number of symbols is less than the prediction, then, if the transmitter includes a buffer, then additional random values may be transmitted at end, which will not be read by the receiver because the encoder knows when to stop a priori by the number of output bits. In some embodiments where the symbol buffer is at the receiver, some additional information is transmitted to identify the "head" of the sequence in cases where the symbol packet happens to be short of the expected total. In some embodiments, this additional information is transmitted in one extra word of the transmitted message, where this word indicates the number of packets to skip to the "head" word (which is the most significant restricted packet of the final state of the decoder). Details regarding the configuration of the arithmetic decoder 690 (as well as the configuration of the arithmetic encoder 830 described with respect to FIG. 8) will be discussed in more detail below. In some embodiments, the arithmetic decoder is an Asymmetric Numeral Systems (ANS) decoder. In some embodiments, the ANS decoder is a Table ANS (tANS) codec that requires only table lookups, shifts, and additions to compute an updated state (x) and a symbol (s) based on an input state (x'). Implementations of ANS codecs, including tANS codecs are described in Duda, Jarek. "Asymmetric numeral systems: entropy coding combining speed of Huffman coding with compression rate of arithmetic coding." *arXiv preprint arXiv:*1311.2540 (2013). and Duda, Jarek, et al. "The use of asymmetric numeral systems as an accurate replacement for Huffman coding." 2015 *Picture Coding Symposium (PCS)*. IEEE, 2015. the entire disclosures of which are incorporated by reference herein.

In some embodiments, ANS is implemented in parallel streams to trade gates for clockspeed. In some embodiments, parallel streams are implemented as follows: for a single stream table ANS (tANS) system, after determining the number of bits required to encode from the state, there are two operations which can happen concurrently: using the number of bits to encode (1) the new state obtained from the old state and (2) the bit sequence is obtained from the old state. In parallel encoding a second encoder and a second state may be used in parallel; recalling that the beginning state in ANS can be selected arbitrarily. Thus, by separating the symbol sequence into "even" and "odd" symbols, the two encoders operate in parallel (Step 1) with two different states and creates the bit sequence in parallel (Step 2). The two bitstreams are then merged, such as by sending the bit length found in the first encoder (which is always the first step) to the second encoder and vice versa. The two memory locations are non-overlapping and a multiport memory would allow this operation to occur concurrently. Similarly, for a single stream ANS decoder the first step is to determine the number of bits to read from the input bitstream. Then there are two operations that can happen concurrently: using the number of bits to read from the input bitstream the decoder (1) computes the new state from the old state and (2) removes the bits from the bit stream. Similar to the ANS encoder, the ANS decoder can operate with a second decoder and second state in parallel with the first decoder with a different state. The point of coordination between the two is the number of bits to remove from the input bitstream. As long as second decoder knows the number of bits the first decoder will be removing and vice versa then the bits may be removed from the input bitstream in parallel; equivalently the pointer to the data stream can be updated. Given a sufficiently long stream to encode/decode, the parallel nature of tANS can be expanded to as many parallel streams as required. For the transmitter using an ANS decoder, the ending state (which must be transmitted) is balanced in bitwidth by the symbol(s) that are encoded in the startup state. So, for tANS there is virtually no compression penalty for having multiple encoders and equivalent decoders, except that for best parallel efficiency the number of symbols should be divisible by the number of encoders/decoders. Coordinating the parallel bitstream writing and reading can incur an $O(\log(x))$ penalty, where x is the number of encoders/decoders. As is common in parallel implementations, it may be possible this communication penalty can be "hidden" by the computation steps.

The transmitter 600 transmits the ending state of the arithmetic decoder (e.g., the last state after outputting the last codeword) and transmits the restricted packets or codewords to a receiver over a channel (e.g., a data link 50 as shown in FIG. 1). The ending state, however, must be sent as codewords in the restricted base (e.g., cannot include instances of the excluded codewords). Therefore, some aspects of embodiments further relate to encoding the ending state for transmission to the receiver. At the end of the arithmetic decoding process performed by the arithmetic decoder 690 at operation 790, the transmitter converts the ending state of the decoder to a new radix (e.g., converts the values to a different base, where the values in the different base are mapped to corresponding allowed codewords and none of the values in the different base are mapped to excluded codewords) that is not the same as the starting values. For example, in the case of 6-bit words (q=6) and $M=2^{11}$, then 11 bits of the packet may be used as the X bits of the starting state identified in operation 770. The memory contents after the decoding can always be sent as two 6-bit restricted words. Extra bits are needed in order to handle the case of overflow in the new radix (in this particular case two extra bits) and these bits are amortized over the number of words that are sent. Extra bits are needed in order to handle the case of overflow in the new radix, and these bits are amortized over the number of words that are sent. For example, for the case of excluding two 6 bit words out of 64, 11 bits may always be converted to two 6-bit restricted words since the mapping only requires 2048 values to be mapped to 62×62=3844 values.

Figure 8:
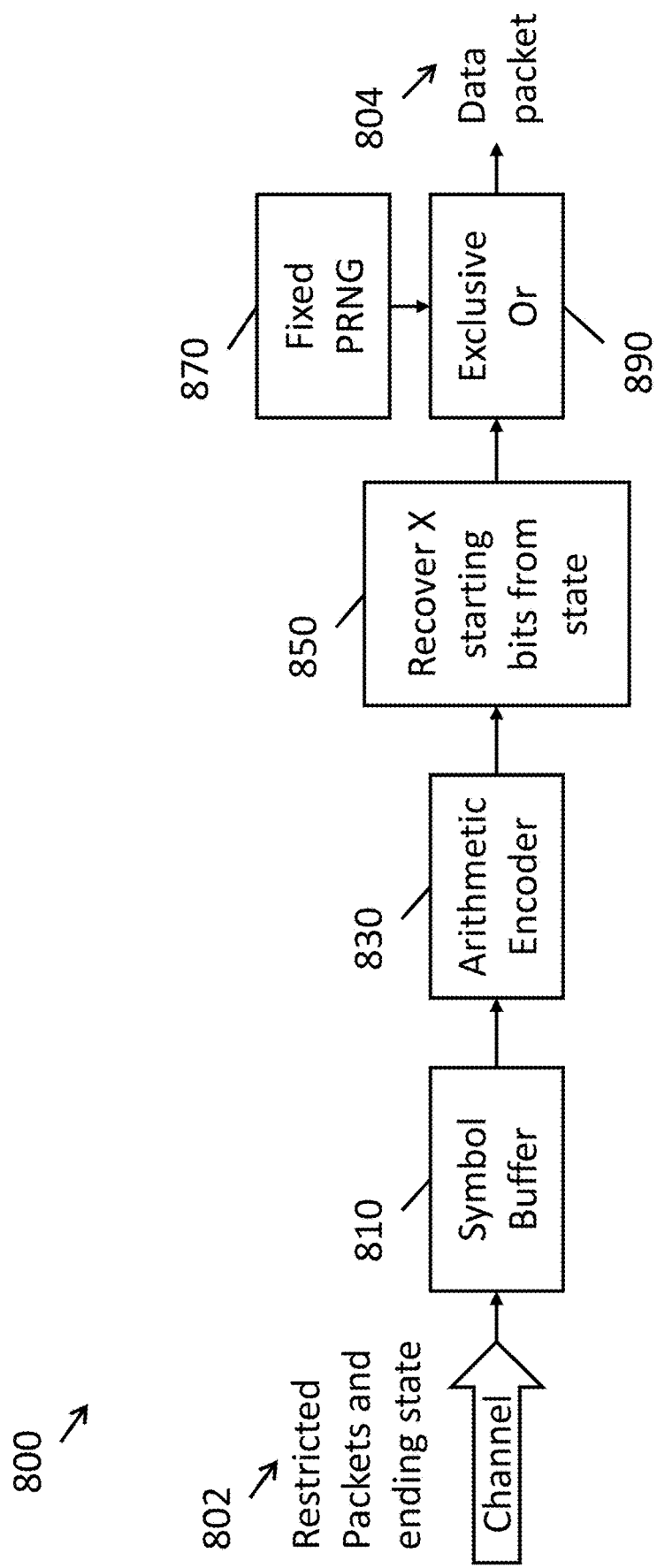
FIG. 8 is a schematic depiction of a receiver including an arithmetic encoder according to one embodiment of the present disclosure.
Figure 9:
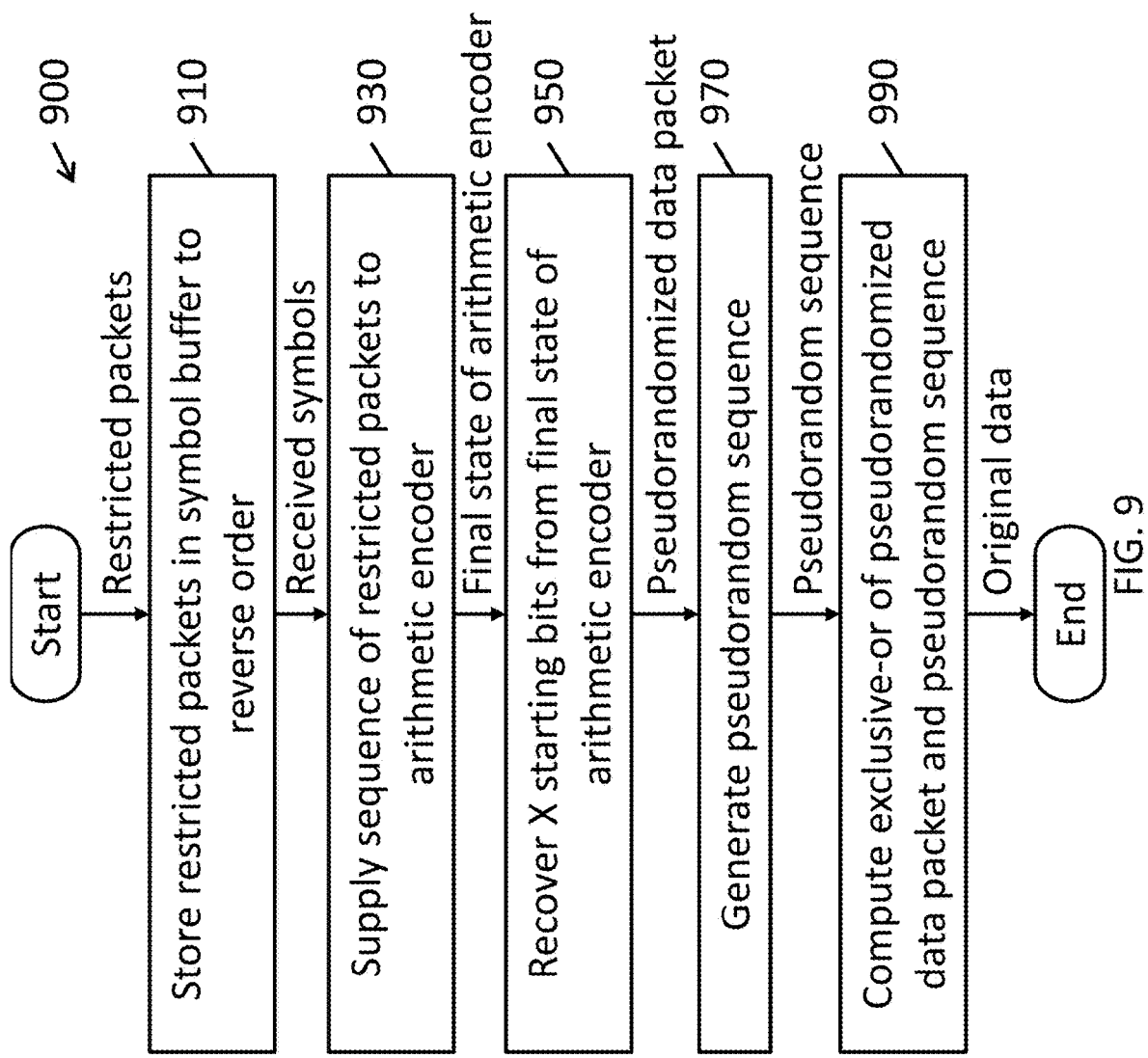
FIG. 9 is a flowchart depicting a method for decoding encoded data to recover original data according to one embodiment of the present disclosure.

FIG. 8 is a schematic depiction of a receiver 800 including an arithmetic encoder according to one embodiment of the present disclosure. FIG. 9 is a flowchart depicting a method 900 for decoding encoded data to recover original data according to one embodiment of the present disclosure.

Figure 11:
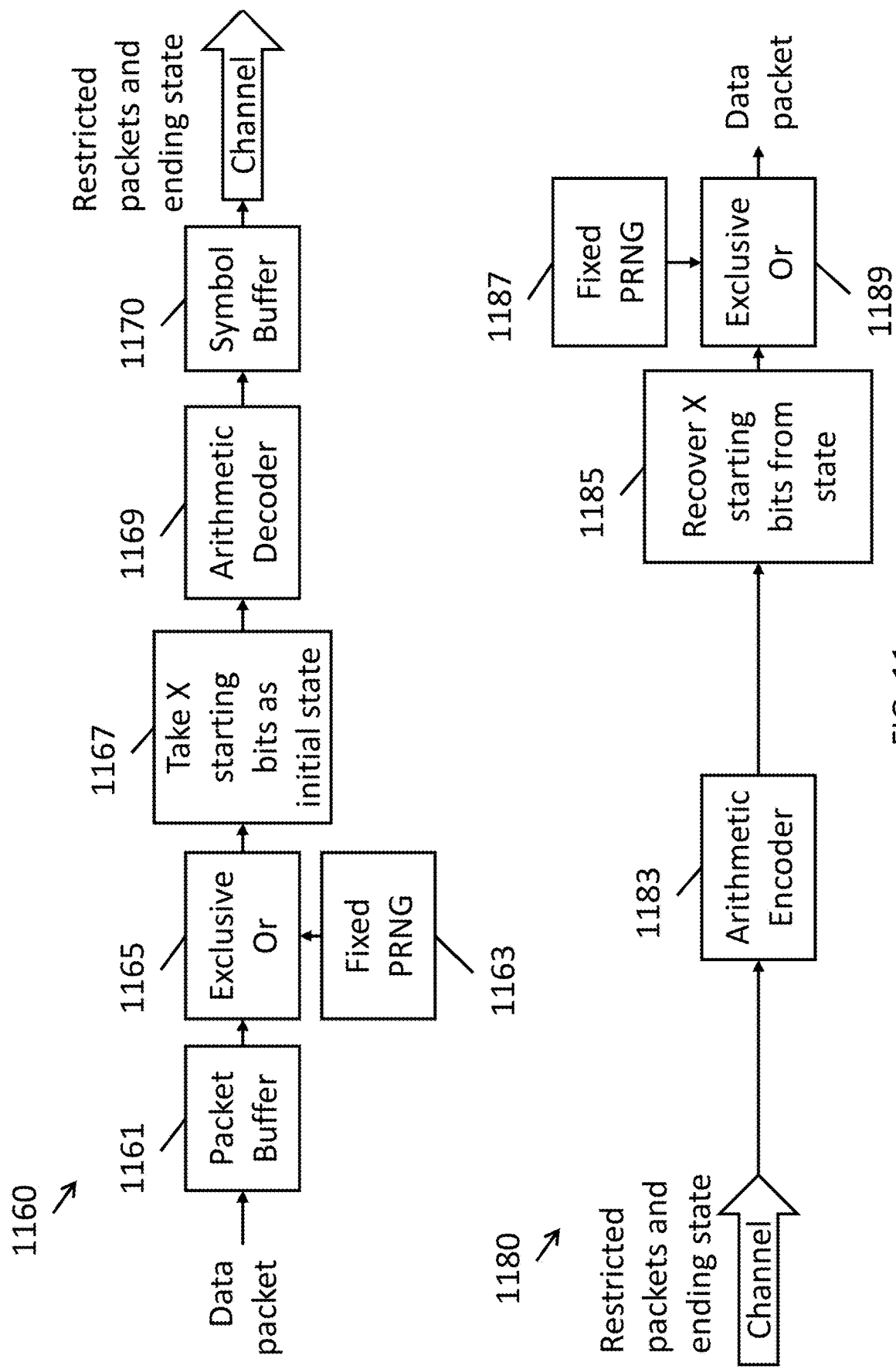
FIG. 11 depicts an embodiment of a transmitter and receiver pair in which the symbol buffer is located at the transmitter rather than the receiver according to one embodiment of the present disclosure.

As shown in FIG. 8, a receiver 800 receives restricted packets and the ending state 802 from a channel (e.g., the data link 50 as shown in FIG. 1) to reconstruct the data packet 804 that was originally supplied to a transmitter, which generated the restricted packets and ending state 802 using an arithmetic decoder. As noted above, in an arithmetic numeral systems (ANS) encoder/decoder, the process of encoding and decoding symbols in the state causes the order of the symbols to be reversed (e.g., processed on a first-in/last-out (FILO) basis or, equivalently, on a last-in/first out (LIFO) basis). Therefore, in order to maintain the correct order of data values, symbol order is reversed such that the lasts symbols are processed first by the encoder. This can occur at the output of the transmitter or at the input to the receiver. In more detail, the receiver 800 stores the received symbols (e.g., the q-bit words) in a symbol buffer 810 at operation 910 to reverse the order of the symbols (see, e.g., FIG. 11 depicting another embodiment where the symbol buffer is at the output of the transmitter) and, at operation 930, supplies the restricted packets (in reverse order) to an arithmetic encoder 830, which is configured in a manner similar to the arithmetic decoder 690 as shown in FIG. 6. In the event that the symbol buffer is implemented in the receiver, it may be necessary to signal the exact number of words emitted by the decoder, as it is possible when using ANS that the number of words may be smaller than the predicted number of words based on the efficiency and the size of the packet. Normally the predicted value is rounded up to account for some inefficiencies in the system. In this way the encoder knows which of the words is the actual starting word and can skip the padding words, which may be random restricted packets or predefined restricted packets. In the case that the symbol buffer is implemented in the transmitter (see, e.g., FIG. 11), the padding words can be transmitted at the end; they will not be read because the encoder knows the maximum number of bytes to output. In some embodiments of the present disclosure, the arithmetic encoder 830 is implemented in hardware, such as digital logic implemented in an AP, a GPU, a DDIC, a DSP, an FPGA, an ASIC, or the like. In some embodiments of the present disclosure, the arithmetic encoder 830 is implemented in software, such as by executing instructions on a processor including an arithmetic logic unit (ALU), such as a CPU, AP, or GPU.

As noted above, an arithmetic encoder implements an encoder function $C(s,x)=x'$ to compute a new state x' based on a previous state x and a next symbol s. By supplying the received ending state and iteratively supplying the received restricted packets to the arithmetic encoder 830 as successive symbols of a sequence, the arithmetic encoder 830 recovers the original state (the initial state discussed above with respect to FIGS. 6 and 7) that was supplied as input to the arithmetic decoder 690 (e.g., the bits that were selected from the pseudorandomized data packet and stored at 670 of FIG. 6 and at operation 770 of FIG. 7), where the recovered state matches the X bits taken from the (pseudorandomized) input data packet. In some embodiments, the arithmetic encoder is an Asymmetric Numeral Systems (ANS) encoder. In some embodiments, the ANS encoder is a Table ANS (tANS) codec that requires only table lookups, shifts, and additions to compute an updated state (x') based on an input symbol (s) and an input state (x). After supplying all of the symbols of the message to the arithmetic encoder 830 to compute successive states, the arithmetic encoder 830 outputs a final state. The number of codewords used for each set of X bits of the data packet may be set a priori (e.g., and padded, as needed, as discussed above) or the number of codewords may be sent in a side channel. Another, less efficient approach includes sending a stop symbol to indicate the end of the sequence of codewords.

At operation 950, a memory 850 stores the X starting bits recovered from the final state by the arithmetic encoder 830 to output a pseudorandomized data packet (assuming no corruption of the data, the recovered pseudorandomized data packet computed at operation 750).

At operation 970, a fixed PRNG 870 of the receiver 800 generates a pseudorandom bit sequence. The fixed PRNG 870 of the receiver 800 is configured with the same seed as the fixed PRNG 630 of the transmitter 600 and therefore both the transmitter fixed PRNG 630 and the receiver fixed PRNG 870 generate the same pseudorandom bit sequences.

The seed may be shared between the transmitter 600 and the receiver 800 as side information provided in-band through the channel or through a side-band, or may be pre-shared fixed information. For example, in the case of pre-shared fixed information, the transmitter and receiver may reuse the same seed for each communication session or both the transmitter and receiver may deterministically derive a same new seed for their respective PRNGs based on shared information (e.g., a shared fixed value) and other information to synchronize the transmitter and the receiver (e.g., an epoch number or a timestamp).

At operation 990, an exclusive-or circuit 890 computes the exclusive-or (XOR) of the pseudorandomized data packet and the pseudorandom bit sequence, thereby recovering the original data packet. As noted above, although the arithmetic decoder/arithmetic encoder have the effect of reversing the order of the symbols due to the first-in/last-out behavior, the initial reversal of the data packet at operation 710 causes the final data packet 804 output by the exclusive-or circuit 890 to have the same order of bits as the original input data packet 602.

The processes described above are repeated for successive sequences of X bits taken from the input data packet to generate the initial state at the transmitter until the entire data packet has been encoded as restricted packets and an ending state using an ANS decoder as described above. Likewise, multiple sequences of restricted packets and a corresponding ending state are received by a receiver and decoded using an ANS encoder as described above to recover the corresponding sequences of X bits of the data packet. In addition, as discussed above, in some embodiments, these processes are parallelized across multiple ANS decoders at the transmitter and across multiple ANS encoders at the decoder.

As noted above, while the embodiments shown in FIGS. 6, 7, 8, and 9 illustrate an embodiment where reversal of the data packet occurs at the transmitter 600 using a packet buffer 610 and where the receiver 800 includes a symbol buffer 810 to buffer the symbols prior to processing by the arithmetic encoder. However, embodiments of the present disclosure are not limited thereto.

Figure 10:
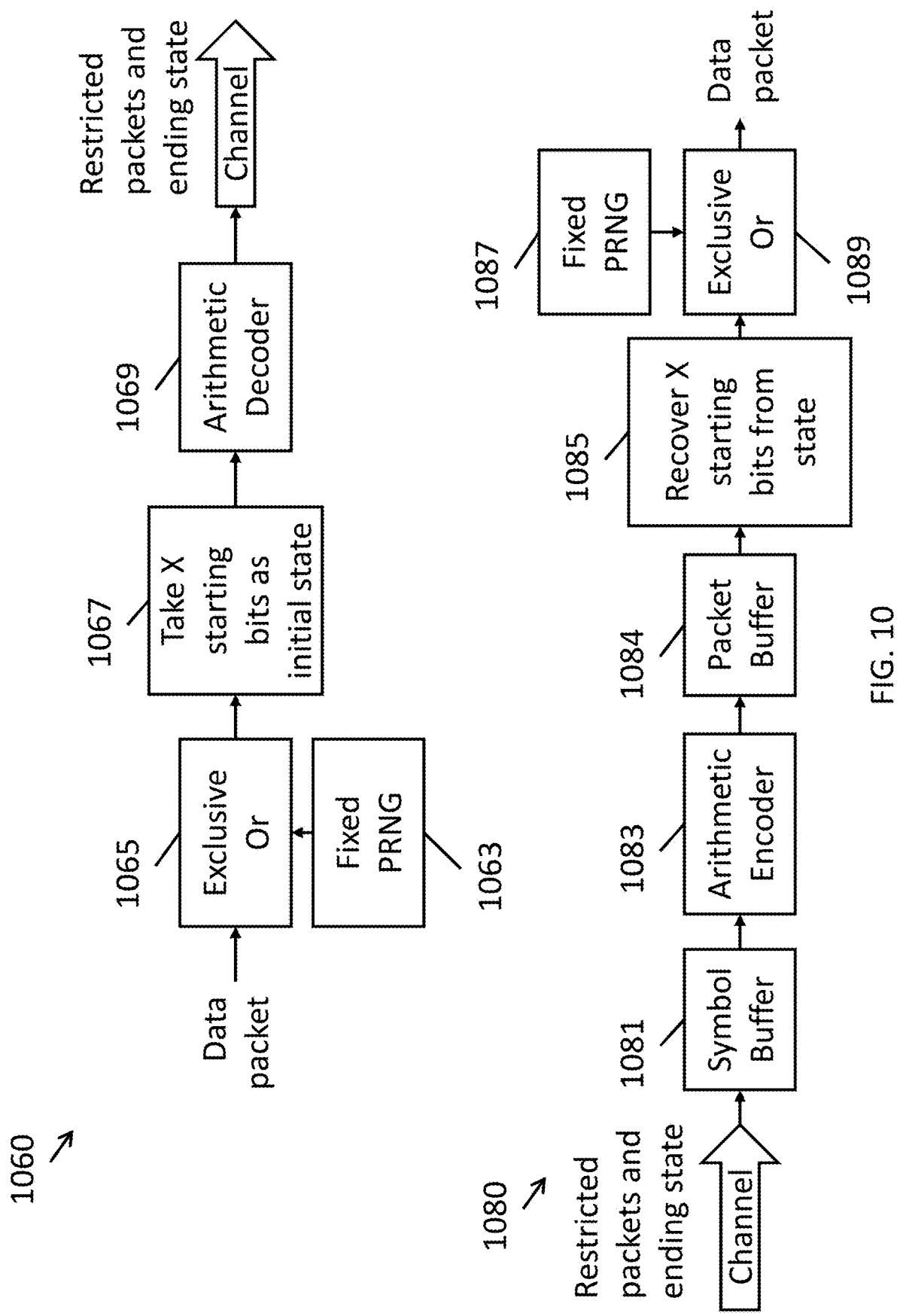
FIG. 10 depicts an embodiment of a transmitter and receiver pair in which a packet buffer is located at a receiver rather than the transmitter according to one embodiment of the present disclosure.

For example, FIG. 10 depicts an embodiment of a transmitter 1060 and receiver 1080 pair in which the packet buffer 1084 is located at the receiver 1080 rather than the transmitter 1060, such that the reversal of the data to restore the original order of the data in the data packet is performed at the receiver. In such an embodiment, all of the buffering is performed at the receiver 1080 and no buffering is performed at the transmitter 1060 (the transmitter is free of buffers).

As another example, FIG. 11 depicts an embodiment of a transmitter 1160 and receiver 1180 pair in which the symbol buffer 1170 is located at the transmitter 1160 rather than the receiver 1180. In such an embodiment, all of the buffering is performed at the transmitter 1160 and no buffering is performed at the receiver 1180 (the receiver is free of buffers).

As would be understood by one skilled in the art, another possible arrangement would include a symbol buffer at the transmitter between the arithmetic decoder and the channel, and a packet buffer to reverse the order of the data at the receiver, between the arithmetic encoder and the recovery of the X starting bits from the final state.

The choice of where to place various buffers may depend on engineering tradeoffs such as the relative cost of including memory or other storage for buffering data at a receiver versus a transmitter. For example, in a display device, it may be more economical to include memory on a transmitter side (e.g., in graphics adapter hardware) than on a receiver side (e.g., within a display panel) in which case placing both the packet buffer and the symbol buffer in the transmitter may be more cost effective than including the packet buffer and/or the symbol buffer in the receiver.

As discussed above, the arithmetic decoder 690 of the transmitter 600 is configured such that it does not output any excluded symbols (e.g., such that the output is restricted to particular symbols and excludes instances of the excluded symbols). This exclusion of particular symbols allows the design of line codes that are tailored to particular use conditions, such as limiting the run length of the line codes (e.g., by excluding the all ones and all zeroes codewords), excluding codewords corresponding to alternating patterns of 0s and 1s (e.g., in the case of 6-bit codewords, the particular codewords 6'b010101 and 6'b101010), or direct current (DC) balance by ensuring that each codeword has an equal number of 0s and 1s (e.g., excluding codewords such as 6'b000100 and 6'b101101 and including or permitting codewords such as 6'b001101 and 6'b000111).

Generally, given a line code with a codeword size of q-bits, there are $Q=2^q$ possible q-bit codewords, with E excluded codewords, such that there are $Q-E=N$ permitted codewords. As a specific example of 6-bit codewords (q=6), there are $2^6=64$ possible codewords and, supposing that the all zeroes codeword (6'b000000) and the all ones codeword (6'b111111) are the only codewords to be excluded, then E=2, such that N=64−2=62.

As noted above, when designing an arithmetic code for highest efficiency, it is desirable for the frequencies (or distribution) of the various symbols in the line code to be maximally flat or maximally uniform, while accounting for other tradeoffs (such as computational complexity) associated with increasing the flatness of the distribution. To review, the frequency of a particular symbol s is denoted as $F_s$ and M is the sum of $F_s$ over all N symbols s, referred to as a total count of all symbols s. In such a case, the frequency $F_s$ with which any particular symbol s appears is approximately M/N. However, if t is not divisible by N (if M mod N≠0), then some symbols will appear more frequently than others, such that the frequency of symbols is not perfectly uniform or perfectly flat. Choosing larger values of M reduces the difference in frequency between different symbols. However larger values of M require more bits to represent those values (in particular, m-bits where $M=2^m$), which thereby increases the complexity of the arithmetic decoder 690 of the transmitter and the arithmetic encoder 830 of the receiver 800. In the specific case of an Asymmetric Numeral System (ANS) encoder/decoder, the state must be b-unique for the encoder and decoder to have the property of being one-to-one and onto. These properties are satisfied when the state is always a value between M and $M^2$ ($x \in [M, M^2]$), which can be represented in $\log_2 M^2$ bits or 2m bits. Accordingly, the state may be updated when performing encoding or decoding using a hardware arithmetic encoder or hardware arithmetic decoder having a hardware bit width of 2m bits, where a hardware encoder or decoder having a narrower bit width is generally less expensive to implement than one with a wider bit width.

Continuing the above example, in the case of q=6 and E=2 to exclude the all zeroes codeword (6'b000000) and the all ones codeword (6'b111111), then N=62. Choosing, for example, m=11 such that $M=2^{11}=2048$ results in sixty of the N=62 symbols having a frequency of 33 and the remaining two symbols having a frequency of 34. Such a choice of m=11 results in the use of an arithmetic encoder and an arithmetic decoder that performs arithmetic on states having a bit width of 2m=22 bits.

Figure 12:
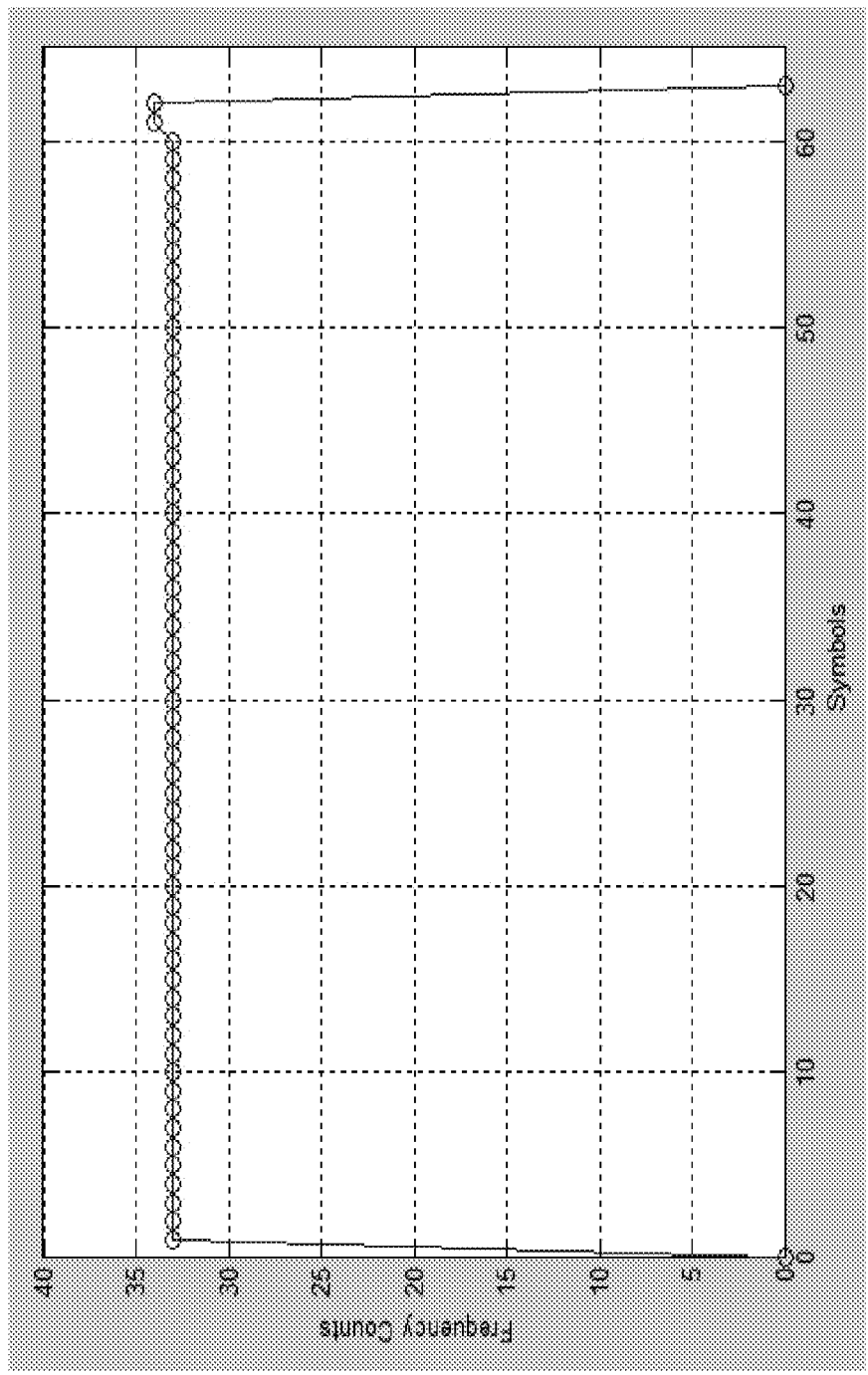
FIG. 12 is a graph showing frequency count of each symbol for a case of 6-bit codewords and a total symbol count of 2,048 with two excluded codewords according to one embodiment of the present disclosure.

FIG. 12 is a graph showing frequency count of each symbol for a case of 6-bit codewords and a total symbol count of 2,048 with two excluded codewords according to one embodiment of the present disclosure. As shown in FIG. 12, the frequency count of the all zeros codeword (represented by the equivalent decimal value of 0) is set to zero and the all ones codeword (equivalent decimal value of 63) is set to zero, such that codewords 1 through 60 have frequency counts of 33 and codewords 61 and 62 have frequency counts of 34.

In general, the frequency counts may be computed in accordance with:

$$k = \left\lceil \frac{M}{N} \right\rceil$$
$$f = k - 1$$
$$a = kN - M$$

where a symbols will have a frequency of f and the remaining N−a symbols will have a frequency of f+1.

Choosing larger values of M will increase the uniformity of the distribution because the relative difference of a count of 1 in the frequency (or counts) between the a symbols having frequency of f and the N−a symbols having frequency of f+1 is diminished. However, as noted above, the tradeoff for increasing M is in an increased bit width of the state x, which must be a value between M and $M^2$ ($x \in [M, M^2)$) and therefore requires at least $\log_2 M^2$ bits to represent the state x.

Figure 13:
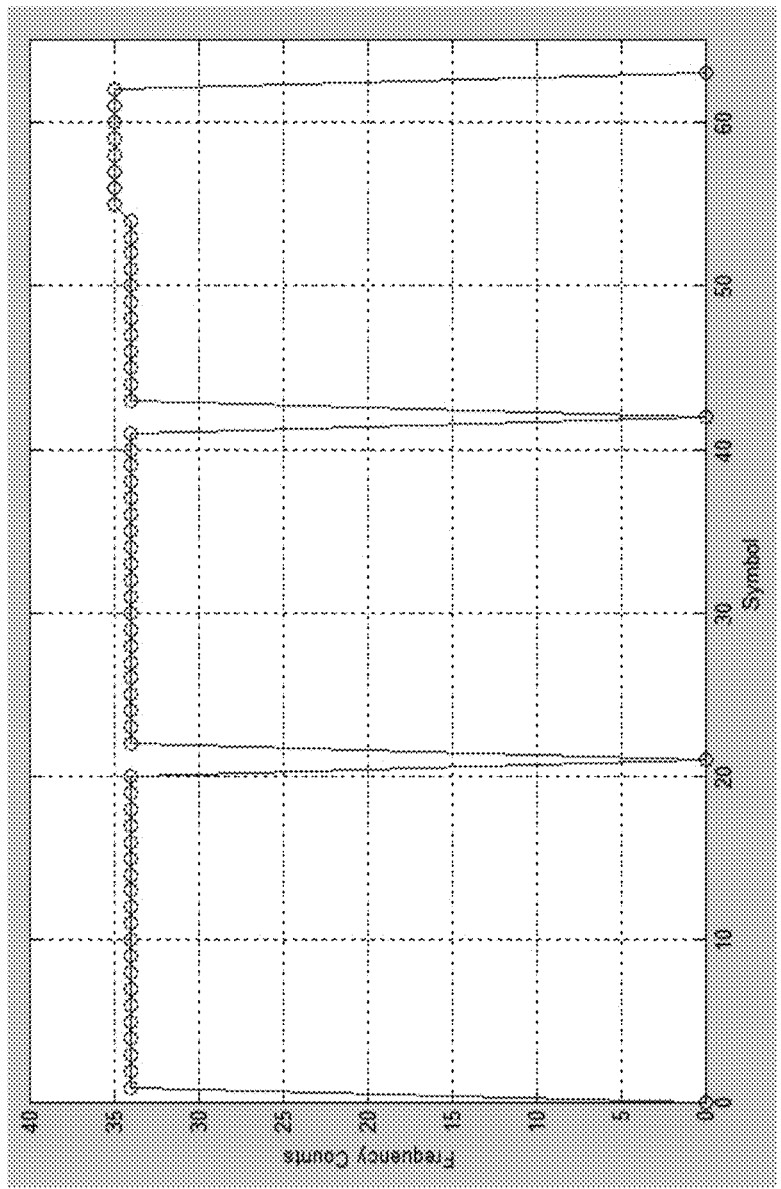
FIG. 13 is a graph showing frequency count of each symbol for a case of 6-bit codewords and a total symbol count of 2,048 with four excluded codewords according to one embodiment of the present disclosure.

FIG. 13 is a graph showing frequency count of each symbol for a case of 6-bit codewords and a total symbol count of 2,048 with four excluded codewords according to one embodiment of the present disclosure. In particular, FIG. 13 show the case where the alternating codewords of 6'b010101 (represented by the equivalent decimal value of 21) and 6'b101010 (represented by the equivalent decimal value of 42) are excluded along with the all zeroes codeword (represented by the equivalent decimal value of 0) and the all ones codeword (equivalent decimal value of 63) by setting the frequencies of these codewords to zero such that the arithmetic decoder does not output these codewords. Referring back to the above notation, given 6-bit codewords, there are Q=64 possible codewords, among which E=4 are excluded. This leaves N=Q−E=64−4=60 allowed codewords or symbols. Taking the case again where m=11 such that M=2048, there are 52 symbols with frequency 34 (shown in FIG. 13 as symbols 1 through 20, 22 through 41, and 43 through 54) and 8 symbols with frequency 35 (shown in FIG. 13 as symbols 55 through 62), where symbols 0, 21, 42, and 63 are the E=4 excluded symbols.

Figure 14:
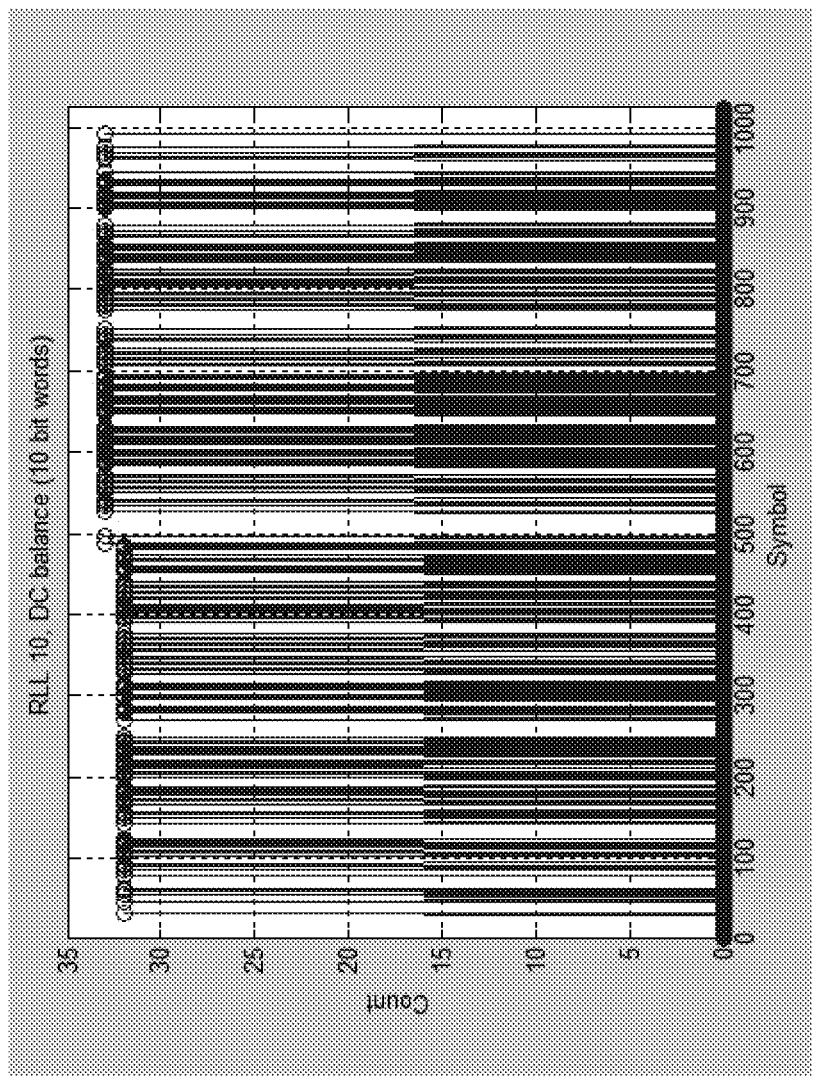
FIG. 14 is a graph showing frequency count of each symbol for a case of 10-bit codewords and a total symbol count of 8,192 where the codewords are DC balanced by allowing only codewords having equal numbers of 0s and 1s (Hamming weight equal to q/2) and excluding all other codewords according to one embodiment of the present disclosure.

FIG. 14 is a graph showing frequency count of each symbol for a case of 10-bit codewords and a total symbol count of 8,192 where the codewords are DC balanced by allowing only codewords having equal numbers of 0s and 1s (Hamming weight equal to q/2) and excluding all other codewords according to one embodiment of the present disclosure. Is some circumstances, communications systems may require DC balanced words (e.g., during initial setup when the communications link or channel may be unstable). Accordingly, the arithmetic decoder and the arithmetic encoder may be configured to exclude all words except those that have equal numbers of 0s and 1s. FIG. 14 illustrates one example where q=10 (10-bit codewords). In such a case, there are $Q=2^{10}=1024$ possible codewords. Only 252 of those 1024 possible codewords are DC balanced (as can be determined by inspecting Pascal's triangle), leaving out about 76.4% of the possible codewords. The run length limit of this code is 10, which is the same as the case of a code using 6-bit codewords that excludes the all zeros and all ones codewords. The efficiency of this code is:

$$\frac{\log 252}{\log 1024} \approx 79.8\%$$

In contrast, in the case of 6-bit codewords with only excluding the all zeroes and all ones words, the efficiency is:

$$\frac{\log 62}{\log 64} \approx 99.2\%$$

Requiring that each codeword be DC balanced ensures no voltage bias for any given 10-bit codeword. In addition, assuming the magnitude of the signal varies from −0.5 to +0.5, the worst case imbalance over 20 bits is +/−0.25 (50%). In contrast, the worst case for a coding system with a run length limit of 10 without DC balance is +/−0.42 (83%).

Some aspects of embodiments of the present disclosure relate to adaptively switching between excluding different codewords based on conditions. When using arithmetic decoders and encoders to generate codewords and recover original data from codewords, excluding words is entirely driven by the symbol frequency table that is used to configure the arithmetic decoders and arithmetic encoders. Accordingly, the coding system used to represent the data For example, during startup of a communications link between a transmitter 600 and a receiver 800, it may be necessary to exclude the alternating codewords (e.g., 6'b010101 and 6'b101010 in the case of 6-bit codewords) in addition to the all zeroes and all ones codewords (6'b000000 and 6'b111111) to ensure good recovery of the embedded clock. As such, a symbol frequency table corresponding to that shown in FIG. 13 may be used. Such a coding system that excludes four codewords (E=4) has an efficiency of about 98.44%.

When the communications link is sufficiently stable, it may be possible to relax the exclusion of the alternating codewords (e.g., 6'b010101 and 6'b101010 in the case of 6-bit codewords) and excluding only the all zeroes and all ones codewords (6'b000000 and 6'b111111). This change in the coding system is implemented by simply changing the symbol frequency table (and packet length) used by the arithmetic decoder 690 and the arithmetic encoder 830, thereby increasing the efficiency to 99.23% while using the same underlying algorithm and hardware. For example, in some embodiments, the change is made by updating the symbol frequency table such that one or more symbols that were previously set to a frequency of 0 are set to a non-zero value (e.g., a value equal to or close to the other symbols having non-zero frequencies). For example, modifying the entries in the symbol frequency table to set the symbol frequency $F_s$ of the alternating codewords (e.g., 6'b010101 and 6'b101010 in the case of 6-bit codewords) to non-zero values while leaving the symbol frequencies of the all zeroes and all ones codewords (6'b000000 and 6'b111111) has the effect of changing the coding scheme to allow the alternating codewords to be output by the arithmetic decoder at the transmitter, and likewise allows the arithmetic encoder at the receiver to be able to receive the alternating codewords.

As another example, in some embodiments, the transmitter or the receiver replaces the full symbol frequency table in its entirety.

The information to change the symbol frequency table at the transmitter and/or the receiver may be transmitted as side information (e.g., out-of-band).

As one example of an implementation with 4-bit codewords and with two excluded codewords, the maximum run length is 6, and the maximum efficiency is log(14)/log(16) 95.18%. With M=128 and a 14-bit state, an example measured efficiency is $31/33$ packets (~93.94%).

As another example of an implementation with 6-bit words and with two excluded codewords, the maximum run length is 10, and the maximum efficiency is log(62)/log(64) 99.24%. With M=512 and an 18 bit state, an example measured efficiency $126/127$ packets (~99.12%).

As a third example of an implementation with 8-bit words and with two excluded codewords, the maximum run length is 14, and the maximum efficiency is log(254)/log(256) 99.86%, with M=32,768 and a 30-bit state.

Accordingly, aspects of embodiments of the present disclosure relate to systems and methods for implementing near optimal packet encoding codes by using an arithmetic decoder to encode input data into a stream of symbols where particular symbols (e.g., particular q-bit codewords) are excluded from the stream of symbols and using an arithmetic encoder to decode the stream of symbols back into the original data. The arithmetic decoder at the transmitter and the arithmetic encoder at the receiver are adaptable and reconfigurable by changing the symbol frequency tables used by the arithmetic decoder and the arithmetic encoder to implement the decoder D and the encoder C. Accordingly, some aspects of embodiments of the present disclosure relate to an adaptive coding system in which code changes based on conditions and requirements of the channel are implemented by updating the symbol frequency tables at the arithmetic decoder and the arithmetic encoder, without making other changes to the method or hardware used to implement the transmitter and the receiver.

While one example application of embodiments of the present disclosure is described above in the context of a serial link between a graphics controller and a display device, embodiments of the present disclosure are not limited thereto and may also be applied in other types of serial data links and serial data buses for connecting to other types of peripherals and computing devices, such as data storage devices (e.g., volatile or non-volatile memories, mass storage devices, and the like), external co-processing devices (e.g., external graphics processing units, artificial intelligence accelerators, and the like), network controllers, other computer systems, smartphones and other portable computing devices, and the like.

Embodiments of the present invention can be implemented in a variety of ways as would be appreciated by a person of ordinary skill in the art, and the term "processor" as used herein may refer to any computing device capable of performing the described operations, such as a programmed general purpose processor (e.g., an ARM processor) with instructions stored in memory connected to the general purpose processor, a field programmable gate array (FPGA), and a custom application specific integrated circuit (ASIC). Embodiments of the present invention can be integrated into a serial communications controller (e.g., a universal serial bus or USB controller), a graphical processing unit (GPU), an intra-panel interface, and other hardware or software systems configured to transmit and receive digital data.

While the present invention has been described in connection with certain example embodiments, it is to be understood that the invention is not limited to the disclosed embodiments, but, on the contrary, is intended to cover various modifications and equivalent arrangements included within the spirit and scope of the appended claims.

What is claimed is:

1. A transmitter comprising:
   a memory configured to store an initial state computed from a bit sequence of an input data packet; and
   an arithmetic decoder configured to generate a symbol based on input bits and a symbol frequency table, wherein the symbol frequency table sets frequencies of one or more excluded symbols to 0 and frequencies of one or more allowed symbols to non-zero values,
   the transmitter being configured to supply the initial state to the arithmetic decoder as the input bits to iteratively generate a sequence of restricted packets and an ending state, the sequence of restricted packets excluding instances of the one or more excluded symbols, and
   the transmitter being configured to transmit the sequence of restricted packets and the ending state on a channel.

2. The transmitter of claim 1, further comprising:
   a packet buffer configured to store the input data packet in reversed sequence.

3. The transmitter of claim 1, further comprising:
   a pseudorandom number generator configured to generate a pseudorandom sequence,
   wherein the initial state is computed based on a pseudorandomized data packet computed from the bit sequence of the input data packet and the pseudorandom sequence.

4. The transmitter of claim 3, further comprising an exclusive-or circuit configured to generate the pseudorandomized data packet by computing an exclusive-or of the pseudorandom sequence and the bit sequence of the input data packet.

5. The transmitter of claim 1, further configured to update the symbol frequency table to set a frequency of an additional symbol to 0.

6. The transmitter of claim 1, further configured to update the symbol frequency table to set a frequency of one the one or more excluded symbols to a non-zero value.

7. The transmitter of claim 1, wherein the arithmetic decoder is an asymmetric numeral systems (ANS) decoder.

8. The transmitter of claim 7, wherein the ANS decoder is a table ANS decoder.

9. A receiver comprising:
   an arithmetic encoder configured to compute a state based on an input state, a symbol, and a symbol frequency table, wherein the symbol frequency table sets frequencies of one or more excluded symbols to 0 and frequencies of one or more allowed symbols to non-zero values,
   the receiver being configured to:
      supply an ending state received from a channel and a plurality of restricted packets received from the channel to the arithmetic encoder to iteratively generate a final state, the restricted packets excluding instances of the one or more excluded symbols, and
      recover a bit sequence from the final state; and
   a memory configured to store a recovered data packet computed based on the bit sequence.

10. The receiver of claim 9, further comprising:
a symbol buffer configured to store the restricted packets in reversed sequence.

11. The receiver of claim 9, further comprising:
a pseudorandom number generator configured to generate a pseudorandom sequence
wherein the receiver is configured to compute the recovered data packet based on the pseudorandom sequence and the bit sequence.

12. The receiver of claim 11, further comprising an exclusive-or circuit configured to generate the recovered data packet by computing an exclusive-or of the pseudorandom sequence and the bit sequence.

13. The receiver of claim 9, further configured to update the symbol frequency table to set a frequency of an additional symbol to 0.

14. The receiver of claim 9, further configured to update the symbol frequency table to set a frequency of one the one or more excluded symbols to a non-zero value.

15. The receiver of claim 9, wherein the arithmetic encoder is an asymmetric numeral systems (ANS) encoder.

16. The receiver of claim 15, wherein the ANS encoder is a table ANS encoder.

17. A communication system comprising:
a transmitter comprising:
a memory configured to store an initial state computed based on a bit sequence of an input data packet; and
an arithmetic decoder configured to generate an output symbol based on input bits and a symbol frequency table, wherein the symbol frequency table sets frequencies of one or more excluded symbols to 0 and frequencies of one or more allowed symbols to non-zero values,
the transmitter being configured to supply the initial state to the arithmetic decoder as the input bits to iteratively generate a sequence of restricted packets and an ending state, the sequence of restricted packets excluding instances of the one or more excluded symbols, and
the transmitter being configured to transmit the sequence of restricted packets and the ending state on a channel;
a symbol buffer configured to store the restricted packets; and
a receiver comprising:
an arithmetic encoder configured to compute an output state based on an input state, an input symbol, and the symbol frequency table,
the receiver being configured to:
supply an ending state received from the channel and the restricted packets to the arithmetic encoder to iteratively generate a final state, the sequence of restricted packets excluding instances of the one or more excluded symbols, and
recover a bit sequence from the final state; and
a memory configured to store a recovered data packet computed based on the bit sequence.

18. The communications system of claim 17,
wherein the transmitter further comprises:
a transmitter pseudorandom number generator configured based on a seed value to generate a pseudorandom sequence; and
a transmitter exclusive-or circuit configured to compute an exclusive-or of the pseudorandom sequence and the bit sequence of the input data packet to compute a pseudorandomized data packet, wherein the initial state is computed based on the pseudorandomized data packet and
wherein the receiver further comprises:
a receiver pseudorandom number generator configured based on the seed value to generate the pseudorandom sequence; and
a receiver exclusive-or circuit configured to compute an exclusive-or of the pseudorandom sequence and the bit sequence to compute the recovered data packet.

19. The communications system of claim 17,
wherein the transmitter further comprises:
a packet buffer configured to store a bit sequence; and the symbol buffer, and
wherein the receiver is free of buffers.

20. The communications system of claim 17,
wherein the receiver further comprises:
a packet buffer configured to store a bit sequence; and the symbol buffer, and
wherein the transmitter is free of buffers.

21. The communications system of claim 17, wherein:
the arithmetic decoder is an asymmetric numeral systems (ANS) decoder, and
the arithmetic encoder is an asymmetric numeral systems (ANS) encoder.

22. The communications system of claim 17, further configured to update the symbol frequency table at the arithmetic decoder and the arithmetic encoder to set a frequency of an additional symbol to 0.

* * * * *